(12) United States Patent
Shim

(10) Patent No.: US 11,469,266 B2
(45) Date of Patent: *Oct. 11, 2022

(54) IMAGE SENSOR INCLUDING A FIRST AND A SECOND ISOLATION LAYER

(71) Applicant: SAMSUNG ELECTRONICS CO., LTD., Suwon-si (KR)

(72) Inventor: Eun Sub Shim, Hwaseong-Si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 168 days.

This patent is subject to a terminal disclaimer.

(21) Appl. No.: 17/037,819

(22) Filed: Sep. 30, 2020

(65) Prior Publication Data

US 2021/0013250 A1    Jan. 14, 2021

Related U.S. Application Data

(63) Continuation of application No. 16/570,273, filed on Sep. 13, 2019, now Pat. No. 10,833,117.

(30) Foreign Application Priority Data

Jan. 7, 2019    (KR) .................. 10-2019-0001526

(51) Int. Cl.
*H01L 27/146* (2006.01)
*H01L 27/118* (2006.01)

(52) U.S. Cl.
CPC .... *H01L 27/1463* (2013.01); *H01L 27/14609* (2013.01); *H01L 27/14621* (2013.01); *H01L 27/14689* (2013.01); *H01L 2027/11861* (2013.01)

(58) Field of Classification Search
CPC .......... H01L 27/1463; H01L 27/14609; H01L 27/14621; H01L 27/14689; H01L 2027/11861; H01L 27/14612; H01L 27/14627; H01L 27/1464; H01L 27/14605; H01L 27/14629
USPC .......................................... 257/294
See application file for complete search history.

(56) References Cited

U.S. PATENT DOCUMENTS

| 9,640,577 B2 | 5/2017 | Oh et al. |
| 10,833,117 B2* | 11/2020 | Shim ............... H01L 27/14605 |
| 2012/0153127 A1 | 6/2012 | Hirigoyen et al. |
| 2012/0217601 A1 | 8/2012 | Miyanami |
| 2015/0091121 A1 | 4/2015 | Manda et al. |
| 2015/0155328 A1 | 6/2015 | Park et al. |

(Continued)

FOREIGN PATENT DOCUMENTS

| JP | H10242312 | 9/1998 |
| JP | 2011119558 | 6/2011 |

(Continued)

*Primary Examiner* — Caleen O Sullivan
(74) *Attorney, Agent, or Firm* — F. Chau & Associates, LLC

(57) ABSTRACT

An image sensor is provided comprising a substrate comprising first and second surfaces opposite to each other. A first isolation layer is disposed on the substrate and forms a boundary of a sensing region. A second isolation layer is disposed at least partially in the substrate within the sensing region and has a closed line shape. A photoelectric conversion device is disposed within the closed line shape of the second isolation layer, and a color filter is disposed on the first surface of the substrate.

18 Claims, 21 Drawing Sheets

(56) References Cited

U.S. PATENT DOCUMENTS

| | | | |
|---|---|---|---|
| 2018/0047766 A1 | 2/2018 | Pyo et al. | |
| 2018/0219040 A1 | 8/2018 | Choi et al. | |
| 2018/0301484 A1 | 10/2018 | Vaartstra et al. | |
| 2020/0098798 A1 | 3/2020 | Takahashi et al. | |
| 2020/0219910 A1 | 7/2020 | Shim | |

FOREIGN PATENT DOCUMENTS

| | | |
|---|---|---|
| KR | 100670606 | 1/2007 |
| KR | 100730469 | 6/2007 |

* cited by examiner

IMAGE SENSOR INCLUDING A FIRST AND A SECOND ISOLATION LAYER This application is a continuation of U.S. patent application Ser. No. 16/570,273 filed on Sep. 13, 2019, which claims priority under 35 U.S.C. § 119 to Korean Patent Application No. 10-2019-0001526, filed on Jan. 7, 2019 in the Korean Intellectual Property Office, the disclosures of which are incorporated by reference herein in their entireties.

TECHNICAL FIELD

The present inventive concept relates to an image sensor, and more particularly, to an image sensor including a first and a second isolation layer.

DESCRIPTION OF THE RELATED ART

An image sensor is a device configured to convert an optical image into a corresponding electrical signal. Image sensors may be categorized into a charge coupled device (CCD) type or a complementary metal oxide semiconductor (CMOS) type. The CMOS type image sensor may be referred to as a CMOS image sensor (CIS). A CIS includes a plurality of 2-dimensionally arranged pixels. Each of the pixels includes a photodiode (PD). The PD functions to convert incident light into an electrical signal.

Demand has increased for image sensors with enhanced performances in a variety of fields, such as digital cameras, camcorders, personal communication systems (PCS), gaming devices, security cameras, medical micro cameras, robots, and so on. Further, the advent of highly-integrated semiconductor devices has enabled the manufacture of highly integrated image sensors.

SUMMARY

According to an exemplary embodiment of the present inventive concept, there is provided an image sensor comprising a substrate comprising first and second surfaces opposite to each other. A first isolation layer is disposed on the substrate and forms a boundary of a sensing region. A second isolation layer is disposed at least partially in the substrate within the sensing region and has a closed line shape. A photoelectric conversion device is disposed within the closed line shape of the second isolation layer, and a color filter is disposed on the first surface of the substrate.

According to an exemplary embodiment of the present inventive concept, there is provided an image sensor comprising a substrate comprising first and second surfaces opposite to each other. A photoelectric conversion device is disposed within the substrate. A first trench is disposed in the substrate. A first isolation layer is disposed in the first trench and forms a boundary of a sensing region. A second trench is spaced apart from the first trench and formed in the substrate of the sensing region. A second isolation layer is disposed in the second trench and surrounds the photoelectric conversion device. A material of the second isolation layer is different from a material of the first isolation layer, and a color filter disposed on the substrate in the sensing region.

According to an exemplary embodiment of the present inventive concept, there is provided an image sensor comprising a substrate comprising first and second surfaces opposite to each other, a first isolation layer disposed in the substrate and forming a boundary of each of a first and second sensing region. A second isolation layer is disposed in the substrate of the first sensing region. The second isolation layer has a closed line shape. A photoelectric conversion device is disposed in the substrate within the closed line shape of the second isolation layer. A color filter is disposed on the first surface of the substrate on the first sensing region, and an infrared filter is disposed on the first surface of the substrate on the second sensing region.

BRIEF DESCRIPTION OF THE DRAWINGS

The above and other features of the present inventive concept will become more apparent to those of ordinary skill in the art by describing in detail exemplary embodiments thereof with reference to the accompanying drawings, in which.

DETAILED DESCRIPTION OF THE EMBODIMENTS

Figure 1:
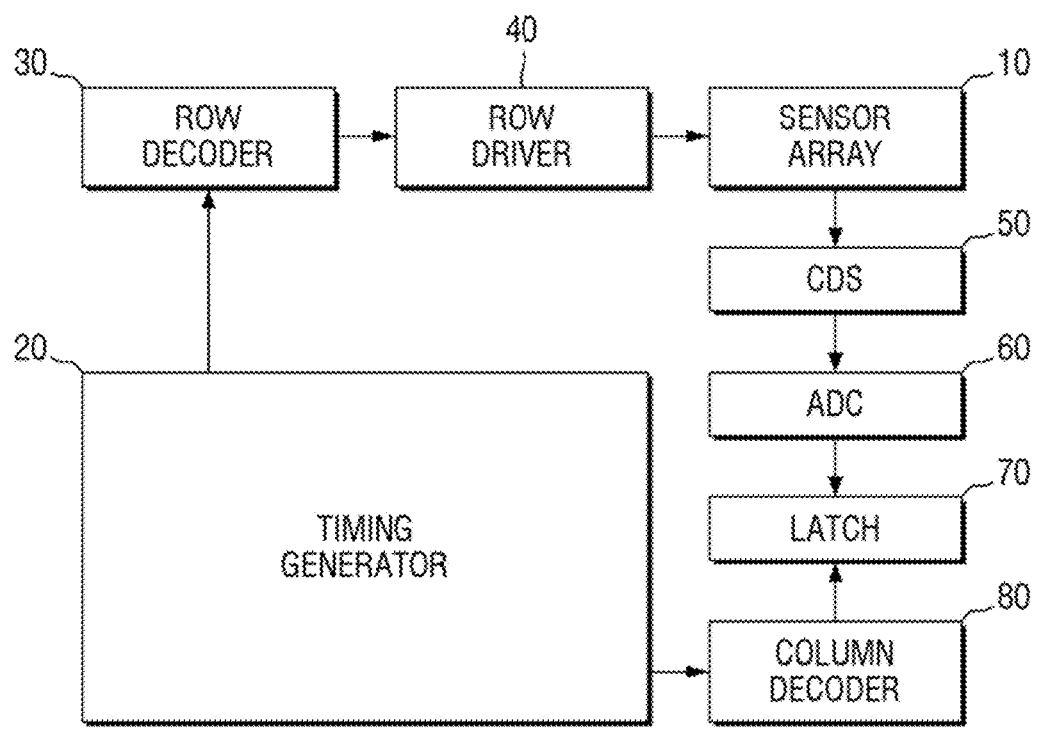
FIG. 1 is a block diagram illustrating an image sensor according to an exemplary embodiment of the present inventive concept.

Hereafter, exemplary embodiments of the present inventive concept will be described more fully with reference to the accompanying drawings. However, the present inventive concept may be embodied in many different forms and should not be construed as limited to the embodiments set forth herein. FIG. 1 is a block view illustrating an image sensor according to an exemplary embodiment of the present inventive concept.

Referring to FIG. 1, the image sensor includes an active pixel sensor array 10, a timing generator 20, a row decoder 30, a row driver 40, a correlated double sampler (CDS) 50, an analog to digital converter (ADC) 60, a latch 70, and a column decoder 80.

The active pixel sensor array 10 includes photoelectric conversion devices and a plurality of 2-dimensionally arranged unit pixels. The plurality of unit pixels may perform a function of converting an optical image into an electrical output signal.

The active pixel sensor array 10 may receive a plurality of driving signals including a row-select signal, a reset signal, and a charge transfer signal, from the row driver 40 and may be driven accordingly. Further, the converted electrical output signal may be provided to the CDS 50 through vertical signal lines.

The timing generator 20 may provide a timing signal and a control signal to the row decoder 30 and the column decoder 80.

The row driver 40 may provide a plurality of driving signals to the active pixel sensor array 10 and drive a plurality of unit pixels according to a result of decoding from the row decoder 30. The driving signals may be provided to each of the rows when the unit pixels are arranged in a matrix form.

The CDS 50 may receive an output signal from the active pixel sensor array 10 through a vertical signal line, and hold and sample the received signal. In other words, the CDS 50 may double-sample a certain noise level and a signal level according to the output signal, and output a difference level corresponding to a difference between the noise level and the signal level.

The ADC 60 may convert an analog signal corresponding to the difference level into a digital signal, and output the result of the conversion.

The latch 70 may latch the digital signal, and the latched signal may be output to an image signal processor according to the result of decoding at the column decoder 80.

Hereinafter, an equivalent circuit view illustrating the sensor array of FIG. 1 according to an exemplary embodiment of the present inventive concept will be described with reference to FIG. 2.

Figure 2:
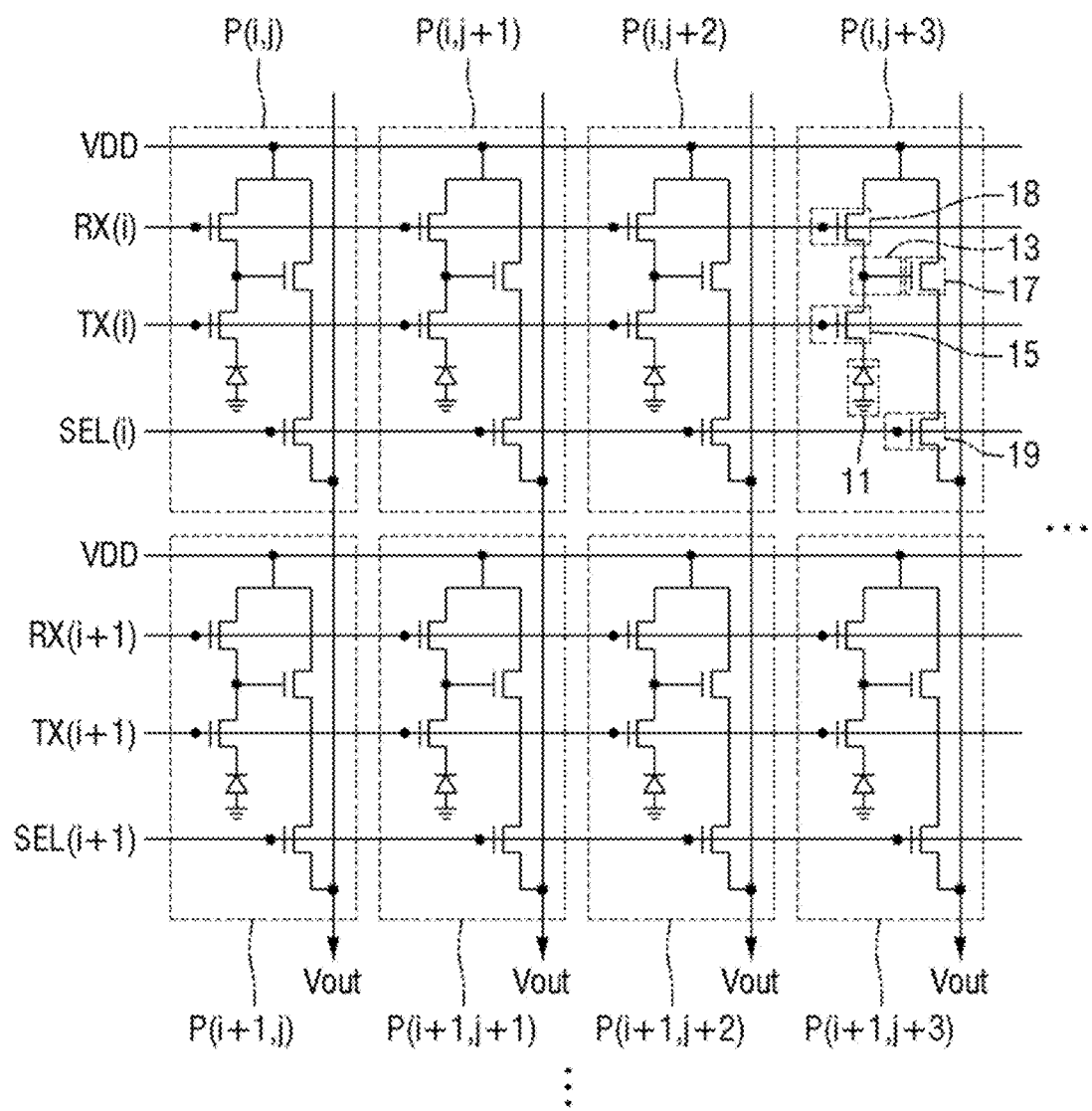
FIG. 2 is an equivalent circuit diagram illustrating a sensor array included in the image sensor of FIG. 1 according to an exemplary embodiment of the present inventive concept.

FIG. 2 is an equivalent circuit view of the sensor array of FIG. 1.

Referring to FIG. 2, pixels P may be arranged in a matrix form constituting the active pixel sensor array 10. At least one of the pixels P includes a photoelectric conversion device 11, a floating diffusion region (FD) 13, a charge transfer device 15, a drive device 17, a reset device 18, and a select device 19. These functions will be described with reference to i-th row pixel (e.g., P(i, j), P(i, j+1), P(i, j+2), P(i, j+3), etc.).

The photoelectric conversion device 11 may absorb incident light and accumulate charge corresponding to a quantity of light. Although a PD is illustrated in the drawings, the photoelectric conversion device 11 may be, for example, a phototransistor, photogate, pinned PD and/or a combination thereof.

The photoelectric conversion device 11 may be coupled with the charge transfer device 15 and transfer the accumulated charges to the FD 13.

The FD 13 is a region in which the charges are converted into corresponding voltages, and because of the parasitic capacitance, the charges may be accumulatively stored.

The drive device 17, exemplified as a source follower amplifier, may amplify change of electrical potential of the FD region 13 where the accumulated charges in the photoelectric conversion device 11 are received and output to an output line Vout.

The reset device 18 is connected to a reset line RX(i) and may periodically reset the FD region 13. The reset device 18 may be composed of one metal oxide semiconductor (MOS) transistor that is driven by a bias provided by the reset line RX(i) that applies a predetermined bias (e.g., the reset signal).

When the reset device 18 is turned on by the bias provided by the reset line RX(i), a predetermined electrical potential provided to a drain of the reset device 18, e.g., a power voltage VDD, may be transmitted to the FD region 13.

The select device 19 is connected to a row select line SEL(i) and may perform a function of selecting a pixel P to read in a row unit. The select device 19 may be composed of a MOS transistor that is driven by the bias (e.g., the row select signal) provided by the row select line SEL(i).

When the select device 19 is turned on by the bias provided by the row select line SEL(i), a predetermined electrical potential provided to a drain of the select device 19 (e.g., a power voltage VDD) may be transmitted to the drain region of the drive device 17.

A transfer line TX(i) that applies the bias to the charge transfer device 15, the reset line RX(i) that applies the bias to the reset device 18, and the row select line SEL(i) that applies the bias to the select device 19 may be extended substantially in parallel with each other in a first direction (e.g., a row direction) and arranged apart from one another by predetermined distances in a second direction (e.g., a direction perpendicular to the first direction).

Figure 3:
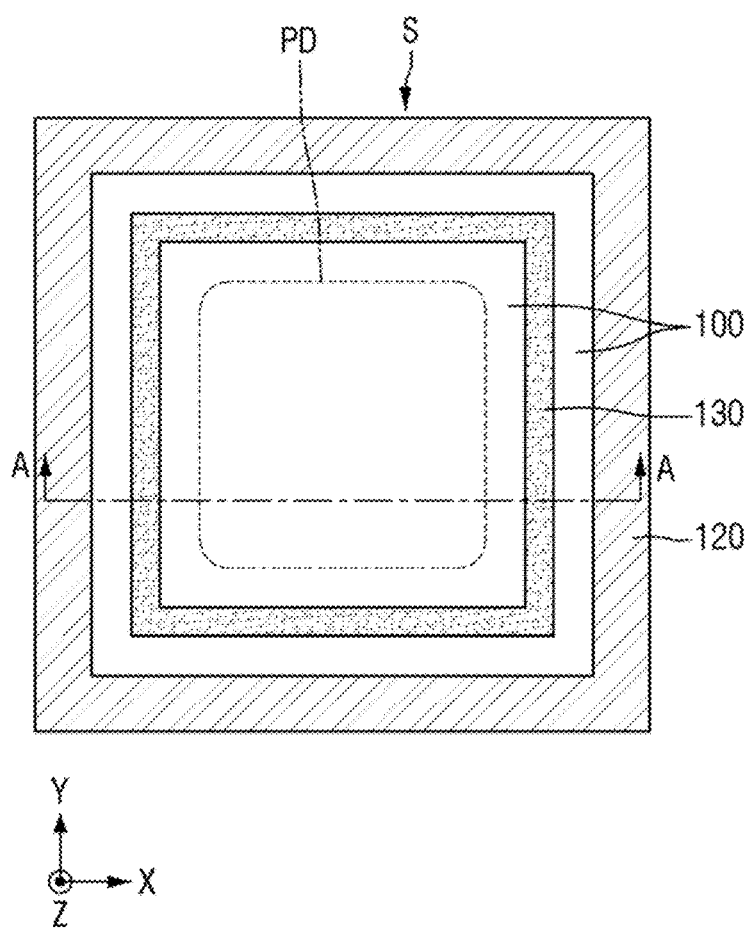
FIG. 3 is a plan view illustrating an image sensor according to an exemplary embodiment of the present inventive concept.
Figure 4:
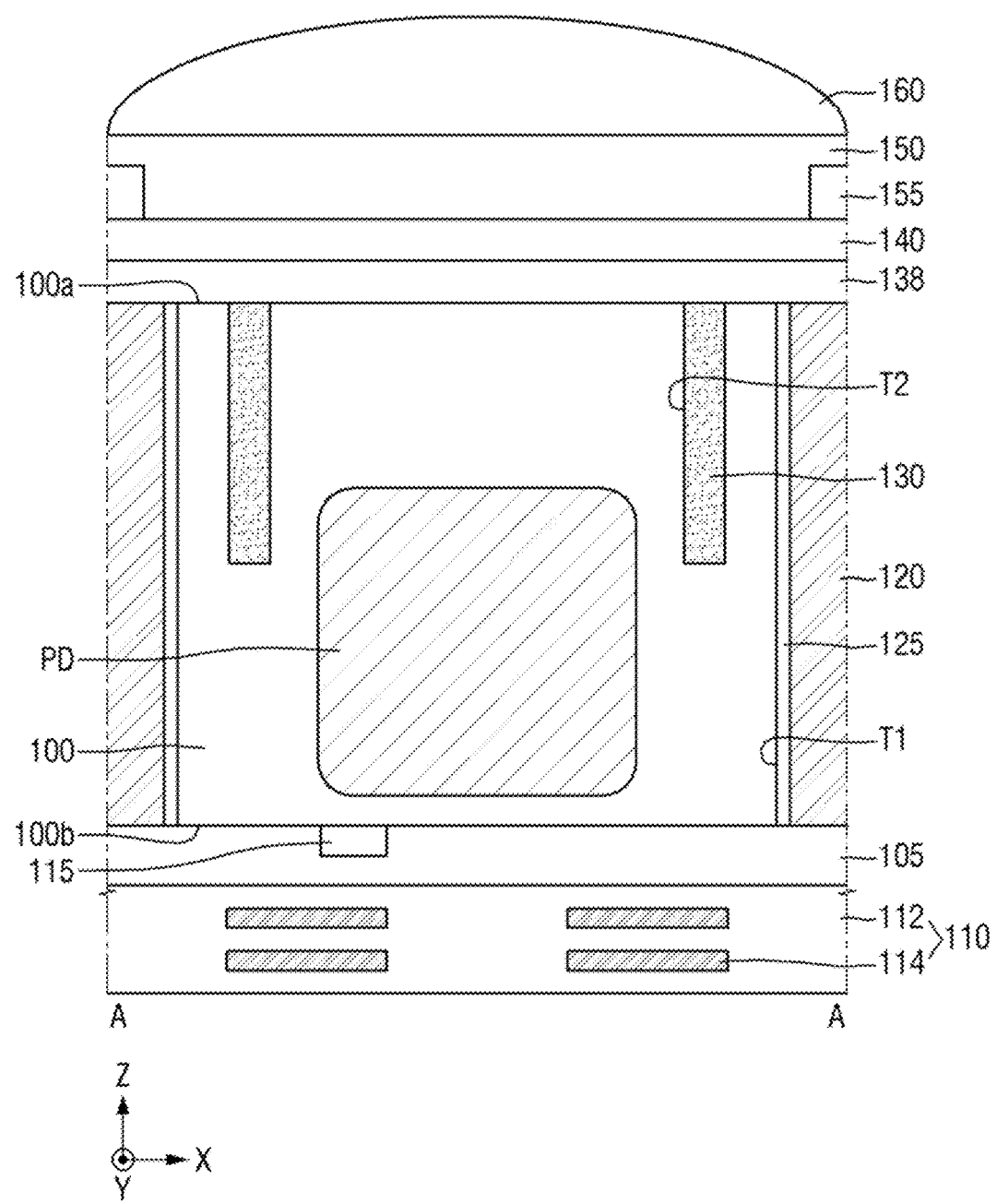
FIG. 4 is a cross-sectional view taken along line A-A of FIG. 3 illustrating an image sensor according to an exemplary embodiment of the present inventive concept.

FIG. 3 is a plan view illustrating an image sensor according to an exemplary embodiment of the present inventive concept. FIG. 4 is a cross-sectional view taken along line A-A of FIG. 3 illustrating an image sensor according to an exemplary embodiment of the present inventive concept.

Referring to FIG. 3 and FIG. 4, the image sensor includes a substrate 100, a PD, an insulating layer 105, an insulating structure 110, a gate 115, a first isolation layer 120, a trench passivation layer 125, a second isolation layer 130, a passivation layer 138, a planarization layer 140, a color filter 150, a side anti-reflection layer 155 and a microlens 160. The sensing region S, when viewed in a plan view, may include an outermost first isolation layer 120 surrounding an outer perimeter of the substrate 100, and the second isolation layer 130 may be disposed within the substrate 100. For example, the substrate 100 may have a first region disposed between the PD and the second isolation layer 120, and a second region disposed between the second isolation layer 120 and the first isolation layer 120. The second trench T2, and consequently the second isolation layer 130 disposed therein, may overlap metal wires 114.

The substrate 100 includes a first surface 100a and a second surface 100b opposite to each other. For example, the substrate 100 may use a P-type or an N-type bulk substrate, or may use a P-type or an N-type epitaxial layer grown on the P-type bulk substrate, or may use a P-type or an N-type epitaxial layer grown on the N-type bulk substrate. Further, a substrate other than a semiconductor substrate, such as an organic plastic substrate, may also be used for the substrate 100.

The sensing region S may be formed in the substrate 100. The sensing region S may be a region where the incident visible light is sensed by the color filter 150. The sensing region S may include the first isolation layer 120, which will be further explained below.

The PD may be formed in the substrate 100 of the sensing region S. The PD may be formed near a second surface 100b of the substrate 100, although the present disclosure is not limited thereto.

The PD may be a phototransistor of FIG. 2 which is described above, e.g., a PD, a phototransistor, a photogate, a pinned-type PD and/or a combination thereof.

The gate 115 may be disposed on a second surface 100b of the substrate 100. Although it is illustrated in FIG. 4 that one gate 15 is disposed on a second surface 100b of the substrate 100, this is only for convenience of explanation. A plurality of gates 115 may be spaced apart from one another in a first direction (e.g., an X direction) and disposed on a second surface 100b.

The gate 115 may include a length extending in a second direction (e.g. a Y direction). For example, the gate 115 may be a gate of the charge transfer device, a gate of the reset device, a gate of the drive device, and so on.

Although it is illustrated in FIG. 4 that the gate 115 is disposed on a second surface 100b of the substrate 100, the present inventive concept is not limited thereto. In other words, according to an exemplary embodiment of the present inventive concept, the gate 115 may be a recessed region in the substrate 100 or buried in the substrate 100 (e.g., enveloped by the substrate 100).

The insulating structure 110 may be disposed on a second surface 100b of the substrate 100. The insulating structure 110 may include at least one metal wire 114 and an interlayer insulating layer 112 disposed to at least partially surround the metal wire 114. For example, the insulating layer 112 may envelop each of a plurality of separately spaced metal wires 114.

The interlayer insulating layer 112 may include, for example, silicon dioxide ($SiO_2$), silicon nitride ($Si_3N_4$), silicon oxynitride ($SiO_xN_y$), and/or a low-k dielectric material.

For example, the metal wire 114 may include aluminum (Al), copper (Cu), tungsten (W), cobalt (Co) and/or ruthenium (Ru). However, the present inventive concept is not limited thereto.

Although it is illustrated in FIG. 4 that the metal wire 114 includes two layers (e.g., two metal wires 114) stacked sequentially, this is for convenience of explanation. For example, the metal wire 114 may be provided in singular or may include a plurality of wires which are sequentially stacked.

The insulating layer 105 may be disposed between a second surface 100b of the substrate 100 and the insulating structure 110. The insulating layer 105 may be disposed to at least partially surround the gate 115 (e.g., cover three side surfaces of the gate 115) disposed on a second surface 100b of the substrate 100.

The insulating layer 105 may include, for example, $SiO_2$, $Si_3N_4$, $SiO_xN_y$, and/or a low-k dielectric material.

The passivation layer 138 may include a high-k insulating material. Further, the passivation layer 138 may include an amorphous crystal structure. More specifically, at least a portion of the high-k insulating material included in the passivation layer 138 may have an amorphous crystal structure. However, the present inventive concept is not limited thereto.

The planarization layer 140 may be disposed on the passivation layer 138. For example, the planarization layer 140 may include a silicon oxide film-based material, a silicon nitride film-based material and/or resin.

The color filter 150 may be disposed on the planarization layer 140. The color filter 150 may be disposed on a first surface 100a of the substrate 100, and disposed between the passivation layer 138 and the microlens 160, to be described below.

The color filter 150 may include, for example, a red color filter, a green color filter, and/or a blue color filter.

The side anti-reflection layer 155 may be formed on the planarization layer 140. The side anti-reflection layer 155 may overlap a portion of the planarization layer 140. The side anti-reflection layer 155 may overlap the first isolation layer 120 which extends in a third direction (e.g., a Z direction). In other words, the side anti-reflection layer 155 may be disposed at an edge of the sensing region S.

The side anti-reflection layer 155 may be disposed on a side surface of the color filter 150. The color filter 150 may overlap a side surface and an upper surface of the side anti-reflection layer 155. In other words, a height of an upper surface of the side anti-reflection layer 155 may be lower than a height of an upper surface of the color filter 150. The side anti-reflection layer 155 may overlap the first isolation layer 120.

The side anti-reflection layer 155 may prevent incident light passing through the color filter 150 from reflecting or scattering to the side surface of the color filter 150. In other words, the side anti-reflection layer 155 may prevent photons reflecting and scattering to an interface of the color filter 150 and the planarization layer 140 from moving to another sensing region S. Because the side anti-reflection layer 155 operates at the interface as described above, it may cover only a portion of the side surface of the color filter 200. For example, the side anti-reflection layer 155 may overlap an edge of the planarization layer 140.

The side anti-reflection layer 155 may include, for example, a metal. The side anti-reflection layer 155 may include tungsten (W), aluminum (Al) and/or copper (Cu).

The microlens 160 may be disposed on the color filter 150. The microlens 160 may be composed of an organic material such as photosensitive resin and/or an inorganic material.

A protection layer with a predetermined thickness may be disposed along an exposed surface (e.g., an upper surface in the Z direction) of the microlens 160. The protection layer may be an inorganic oxide film. For example, the protection layer may include $SiO_2$ film, titanium oxide ($TiO_2$) film, zirconium oxide ($ZrO_2$) film, hafnium oxide ($HfO_2$) film, and/or a stacking film thereof.

A first trench T1 may extend in the third direction (e.g., the Z direction) such that the first trench T1 completely penetrates through the substrate 100. For example, the first trench T1 may extend from the first surface 100a to the second surface 100b of the substrate 100.

A first isolation layer 120 may be disposed in the first trench T1. The first isolation layer 120 may be exposed at each of a first surface 100a and a second surface 100b of the substrate 100.

In other words, the first isolation layer 120 may contact the passivation layer 138 disposed on a first surface 100a of the substrate 100. Further, the first isolation layer 120 may contact the insulating layer 105 disposed on a second surface 100b of the substrate 100. For example, a first end and a second end of the first isolation layer 120 may be coplanar respectively with the first surface 100*a* and the second surface 100*b*.

The first isolation layer 120 may form an outer boundary of the sensing region S. In other words, the sensing region S may include the first isolation layer 120, the substrate 100, and the second isolation layer 130.

The first isolation layer 120 may include a material having excellent gap-fill capabilities, e.g., poly silicon (poly-Si). However, the present inventive concept is not limited thereto.

The trench passivation layer 125 may at least partially cover a sidewall of the first isolation layer 120 in the first trench T1. For example, the trench passivation layer 125 may be disposed to at least partially cover a sidewall of the first isolation layer 120 and may be disposed between the sidewall of the first isolation layer 120 and an adjacent sidewall of the substrate 100.

Although it is illustrated in FIG. 4 that the trench passivation layer 125 is formed conformally in the first trench T1, the present inventive concept is not limited thereto.

Further, although it is illustrated in FIG. 4 that the trench passivation layer 125 is formed as a single film, the present inventive concept is not limited thereto. In other words, according to some other exemplary embodiments, the trench passivation layer 125 may be formed with two or more films in the first trench T1.

The trench passivation layer 125 may include a same material as that of the passivation layer 138, e.g., a high-k insulating material. However, the present inventive concept is not limited thereto. In other words, according to an exemplary embodiment of the present inventive concept, the trench passivation layer 125 may include a different material from that of the passivation layer 138.

A second trench T2 may be disposed in the substrate 100 of the sensing region S nearer to the PD in the first direction (e.g., the X direction) relative to the first trench T1. The second trench T2 may be formed such that the second trench T2 penetrates through a portion of the substrate 100 from a first surface 100*a* of the substrate 100 and extends in the third direction Z. For example, the second trench T2 may have an end portion that at least partially overlaps a side surface of the PD when viewed in a cross-sectional view.

The second trench T2 may be disposed between the first trench T1 and the PD. The second trench 2 may be spaced apart from the first trench T1 by a predetermined distance. Further, the second trench T2 may be spaced apart from the PD in the first direction X and the second direction Y.

The second trench T2 may have a rectangular shape on a plane in parallel with a first surface 100*a* of the substrate 100. For example, the second trench T2 may have a closed line rectangular shape when viewed in a plan view. However, the present inventive concept is not limited thereto.

The PD may be disposed in the substrate 100 of the second trench T2. In other words, the second trench T2 may be formed to at least partially surround a side surface (e.g., a surface extending in the Z direction) of the PD.

The second trench T2 may be formed so as not to completely overlap the PD in the third direction Z orthogonal to a plane of the first surface 100*a* of the substrate 100. At least a portion of the second trench T2 may overlap the PD in the first direction (e.g., the X direction) and the second direction (e.g., the Y direction) viewed in a plan view.

The second isolation layer 130 may be disposed in the second trench T2. The second isolation layer 130 may be exposed from a first surface 100*a* of the substrate 100 and may penetrate through a portion of the substrate 100. However, the second isolation layer 130 may not be exposed at a second surface 100*b* of the substrate 100. In other words, the second isolation layer 130 may be in contact with the passivation layer 138 disposed on a first surface 100*a* of the substrate 100. The second isolation layer 130 may not be in contact with the insulating layer 105 disposed on a second surface 100*b* of the substrate 100.

The second isolation layer 130 may be disposed in the substrate 100 of the sensing region S. The second isolation layer 130 may be spaced apart from the first isolation layer 120 by a predetermined distance. Further, the second isolation layer 130 may be spaced apart from the PD in the first direction (e.g., the X direction) and/or the second direction (e.g., the Y direction). The second isolation layer 130 may at least partially surround at least one side surface of the PD.

According to an exemplary embodiment of the present inventive concept, the second isolation layer 130 may not overlap the PD in the third direction (e.g., the Z direction) orthogonal to a first surface 100*a* of the substrate 100. According to an exemplary embodiment of the present inventive concept, at least a portion of the second isolation layer 130 may overlap the PD in the first direction (e.g., the X direction) and the second direction (e.g., the Y direction).

The second isolation layer 130 may have a rectangular shape on a plane in parallel with a first surface 100*a* of the substrate 100. However, the present inventive concept is not limited thereto. For example, the second isolation layer 130 may have a circular shape surrounding the PD when viewed in a plan view, and/or may have a side extending in the third direction (e.g., the Z direction) that possesses a concave or convex shape. According to an exemplary embodiment of the present inventive concept, the second isolation layer 130 may include a different material from that of the first isolation layer 120. The second isolation layer 130 may include, for example, $HfO_2$, but the present inventive concept is not limited thereto. For example, the second isolation layer 130 may include various materials featuring a high reflectivity.

Although the first trench T1 including the first isolation layer 120 and the second trench T2 including the second isolation layer 130 are shown remotely spaced with side surfaces separated by a portion of the substrate 100, the present inventive concept is not limited thereto. For example, the first and second trenches T1 and T2 may include a buffer portion disposed between adjacent respective sidewalls, or the trenches T1 and T2 may be integrally formed.

The second isolation layer 130 may reflect and therefore guide the incident visible light through the color filter 150 towards the PD.

Although it is illustrated in FIG. 4 that the second isolation layer 130 is formed as a single film, the present inventive concept is not limited thereto. In other words, according to an exemplary embodiment of the present inventive concept, the second isolation layer 130 may be formed with two or more films.

The image sensor according to an exemplary embodiment of the present inventive concept may demonstrate increased reliability by disposing a second isolation layer 130 between the first isolation layer 120 and the PD in the substrate 100 that can reflect visible light and guide the incident visible light passing through the color filter 150 towards the PD effectively.

Hereinafter, a method for fabricating an image sensor according to an exemplary embodiment of the present inventive concept will be explained with reference to FIGS. 5 to 12.

FIG. 5 to FIG. 12 are cross-sectional views taken along line A-A of FIG. 3 illustrating steps in a fabrication process of an image sensor according to an exemplary embodiment of the present inventive concept.

Figure 5:
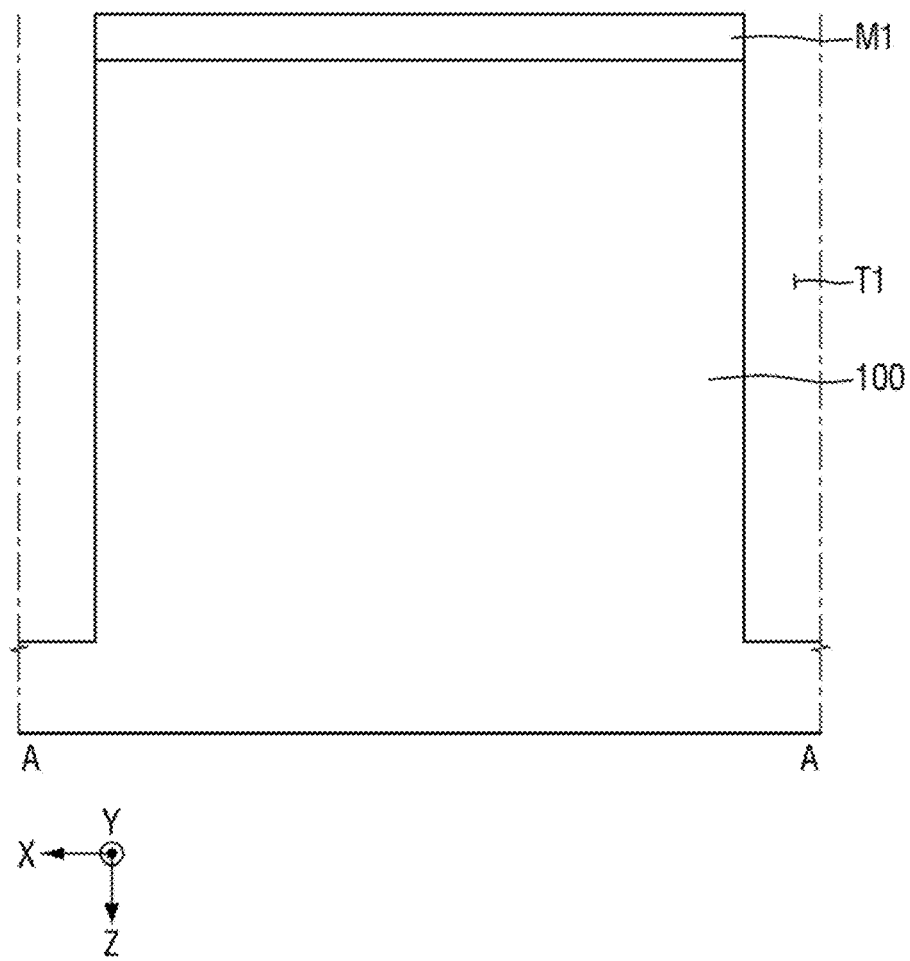
FIGS. 5 to 12 are cross-sectional views taken along line A-A of FIG. 3 illustrating steps in a fabrication process of an image sensor according to an exemplary embodiment of the present inventive concept.

Referring to FIG. 5, a first mask pattern M1 may be formed on the substrate 100.

Thereafter, the first trench T1 may be formed in the substrate 100 by etching the substrate 100 utilizing the first mask pattern M1 as a mask. The first trench T1 may be formed so as to penetrate through a portion of the substrate 100. For example the first trench T1 may extend in the third direction (e.g., the Z direction).

Figure 6:
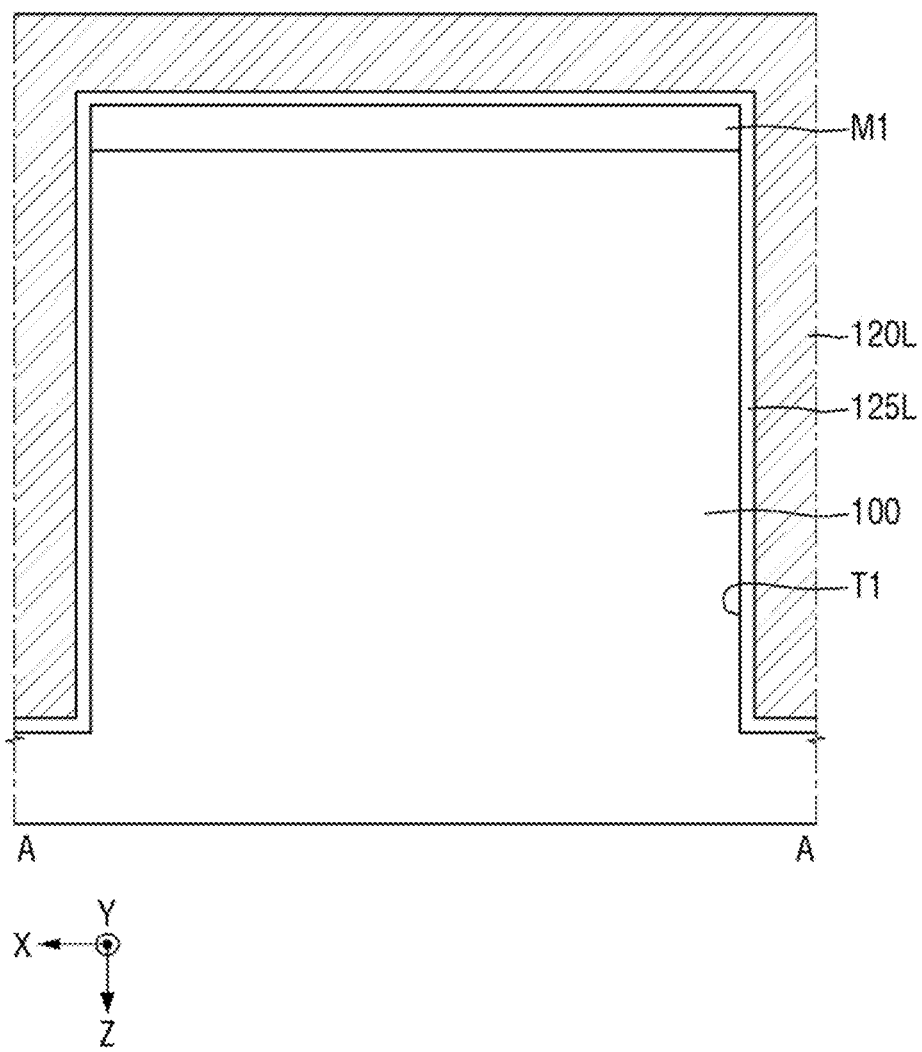

Referring to FIG. 6, a trench passivation material 125L including a high-k insulating material may be formed on the first mask pattern M1, a sidewall of the first trench T1 and a bottom surface of the first trench T1 overlying the substrate 100.

According to an exemplary embodiment of the present inventive concept, the trench passivation material 125L may be formed on a sidewall of the first trench T1 and a bottom surface of the first trench T1 after the first mask pattern M1 is removed from corresponding portions.

Although it is illustrated in FIG. 6 that the trench passivation material 125L is conformally formed on the first mask pattern M1, a sidewall of the first trench T1 and a bottom surface of the first trench T1, the present inventive concept is not limited thereto.

Thereafter, a first filling layer 120L may be formed on the trench passivation material 125L filling the first trench T1. The first filling layer 120L may also be formed on the trench passivation material 125L formed on the first mask pattern M1.

Figure 7:
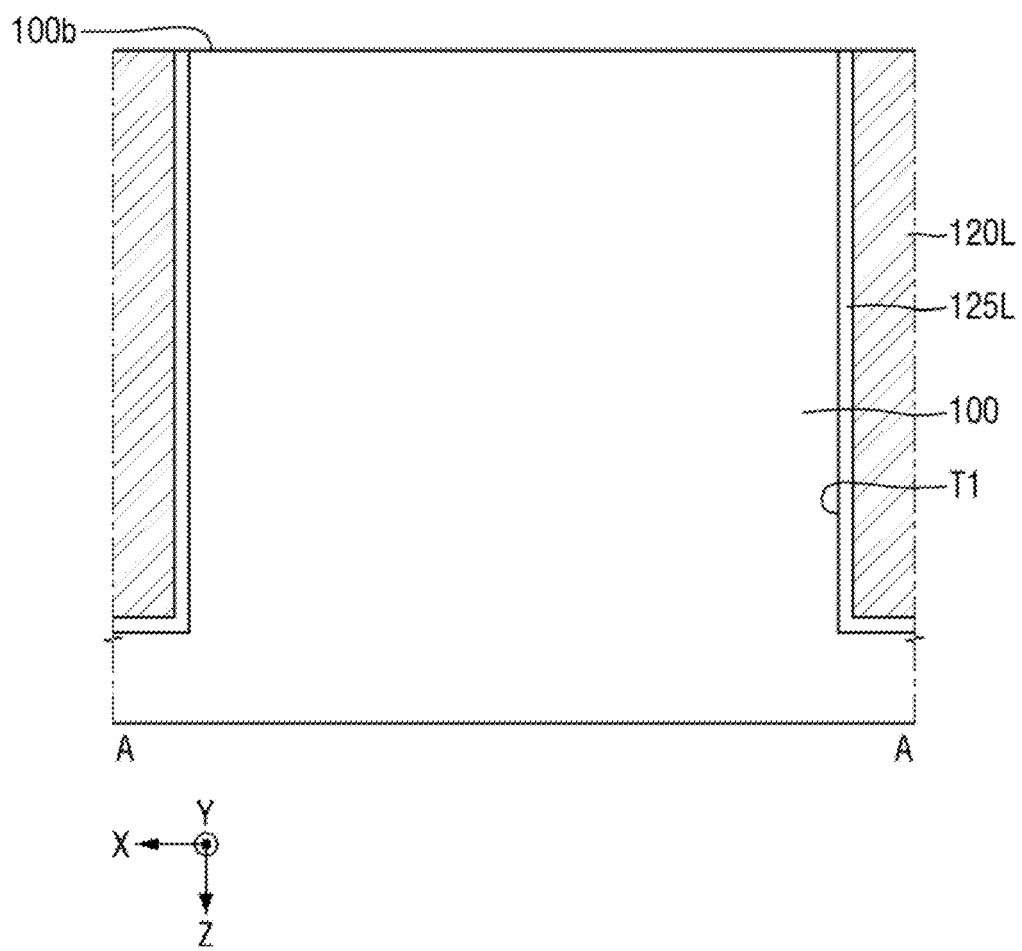

Referring to FIG. 7, performance of the planarization etching process (e.g., a chemical mechanical planarization (CMP) process) may remove a portion of the first filling layer 120L formed on a second surface 100b of the substrate 100, a portion of the trench passivation material 125L, and the remainder of the first mask pattern M1.

Through the planarization etching process, as illustrated in FIG. 7, the first filling layer 120L and the trench passivation material 125L may be exposed from a same plane as a second surface 100b of the substrate 100. For example, the first filling layer 120L and the trench passivation material 125L may have upper portions which are externally exposed and include upper surfaces aligned parallel to a plane of the second surface 100b of the substrate 100.

Figure 8:
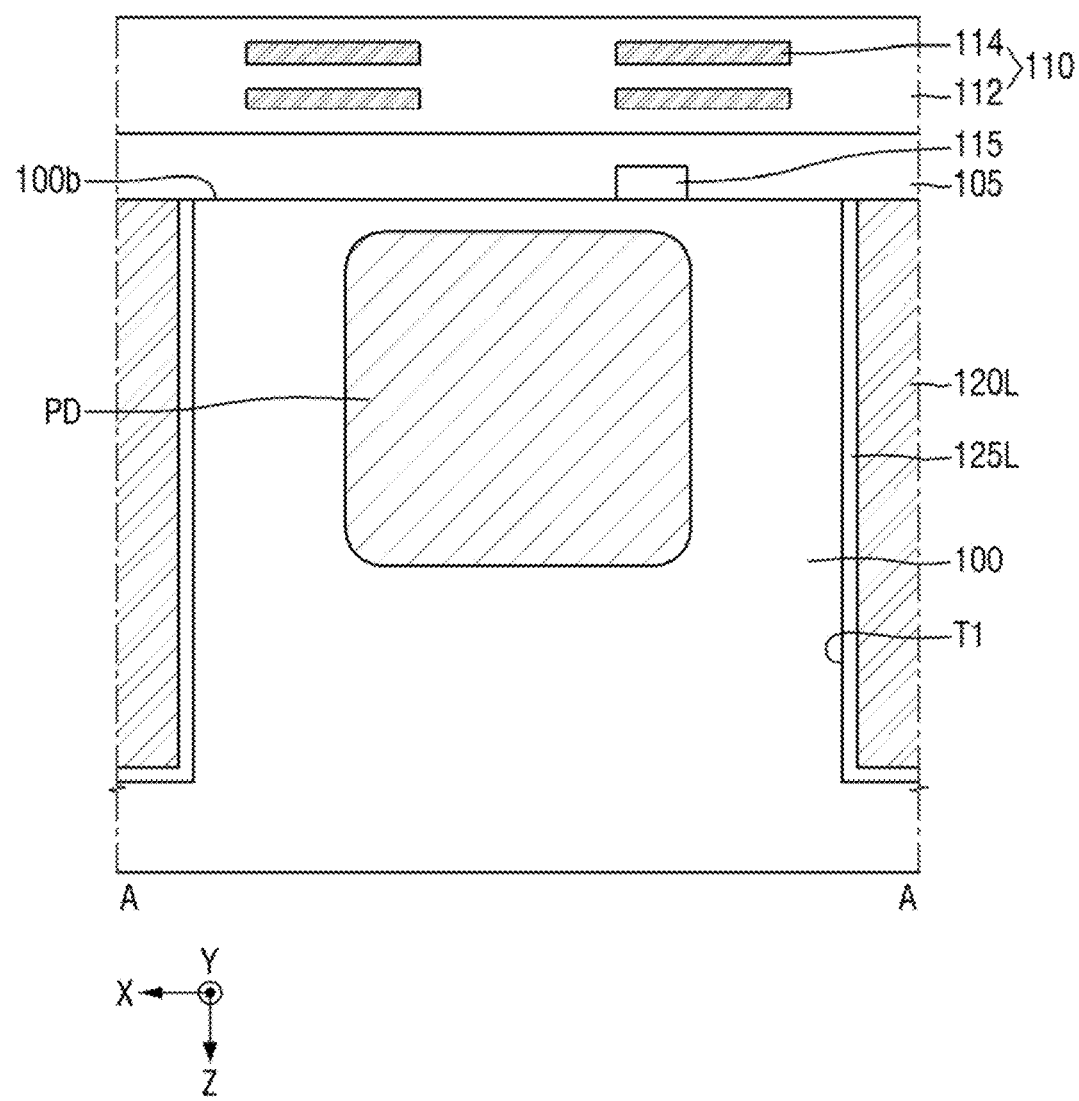

Referring to FIG. 8, the PD may be formed between the first filling layer 120L in the substrate 100. The PD may be formed through an ion implantation process.

Thereafter, the gate 115 may be formed on a second surface 100b of the substrate 100. In this case, the gate 115 may be formed so as not to overlap the first filling layer 120L.

Thereafter, the insulating layer 105 may be formed to overlap a second surface 100b of the substrate 100, the gate 115 and the first filling layer 120L.

Thereafter, the insulating structure 110 including the interlayer insulating layer 112 and the metal wire 114 may be formed on the insulating layer 105.

Figure 9:
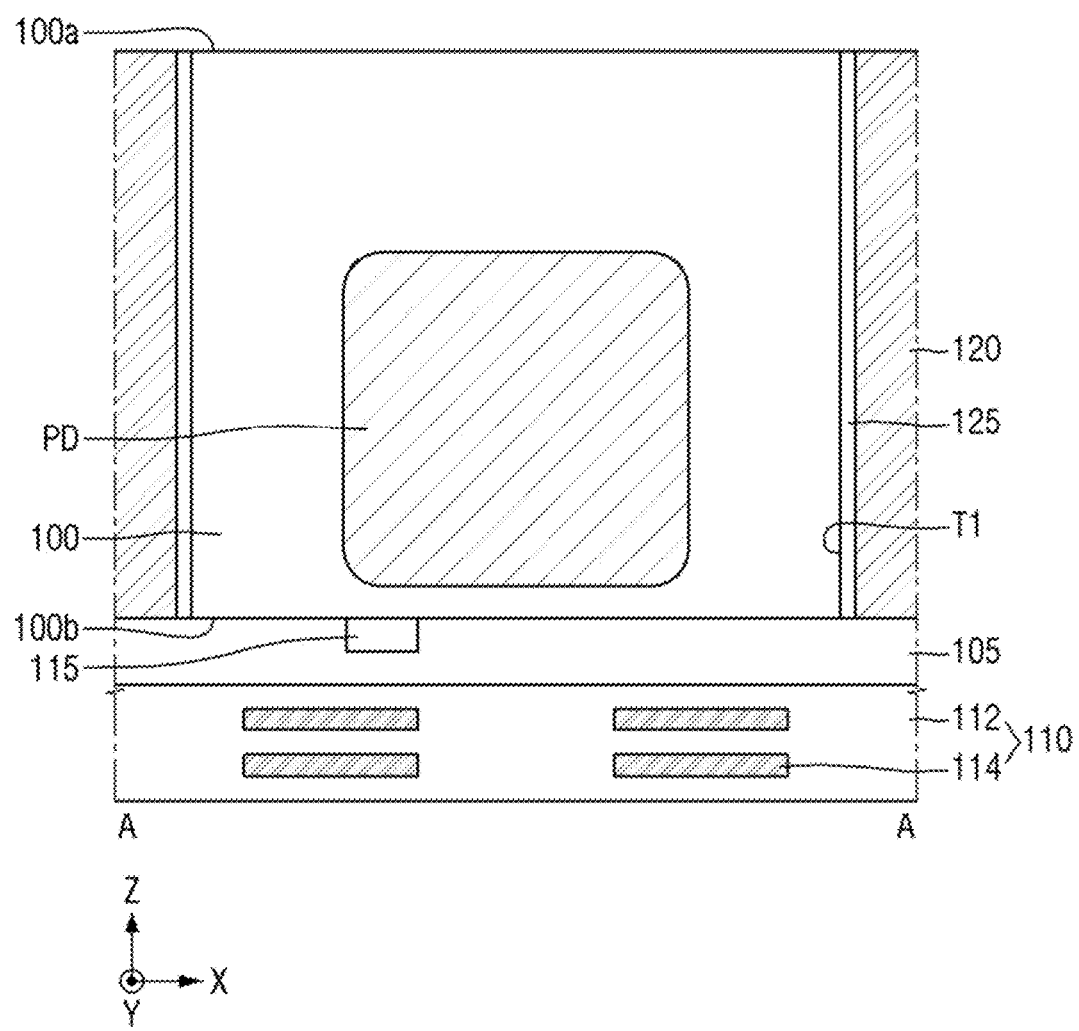

Referring to FIG. 9, a portion of the substrate 100 may be removed to reduce thickness of the substrate 100 (e.g., the first surface 100a). In this case, after the substrate 100 is overturned so that a first surface 100a of the substrate 100 is placed upward, a portion of the substrate 100 may be removed by performing the planarization etching process (e.g., CMP process).

Through the planarization etching process of removing a portion of the substrate 100, the trench passivation material 125L formed on a first surface 100a of the substrate 100 may be removed. Accordingly, the first filling layer 120L formed in the first trench T1 may be exposed (e.g., by an upper end) in same a plane as a plane of the first surface 100a of the substrate 100.

The trench passivation layer 125 may be formed along a sidewall of the first trench T1, and the first isolation layer 120 may fill an inner portion of the first trench T1 and contact a side surface of the trench passivation layer 125. For example, a side surface of the first isolation layer 120 may be disposed on a side surface of the trench passivation layer 125.

Figure 10:
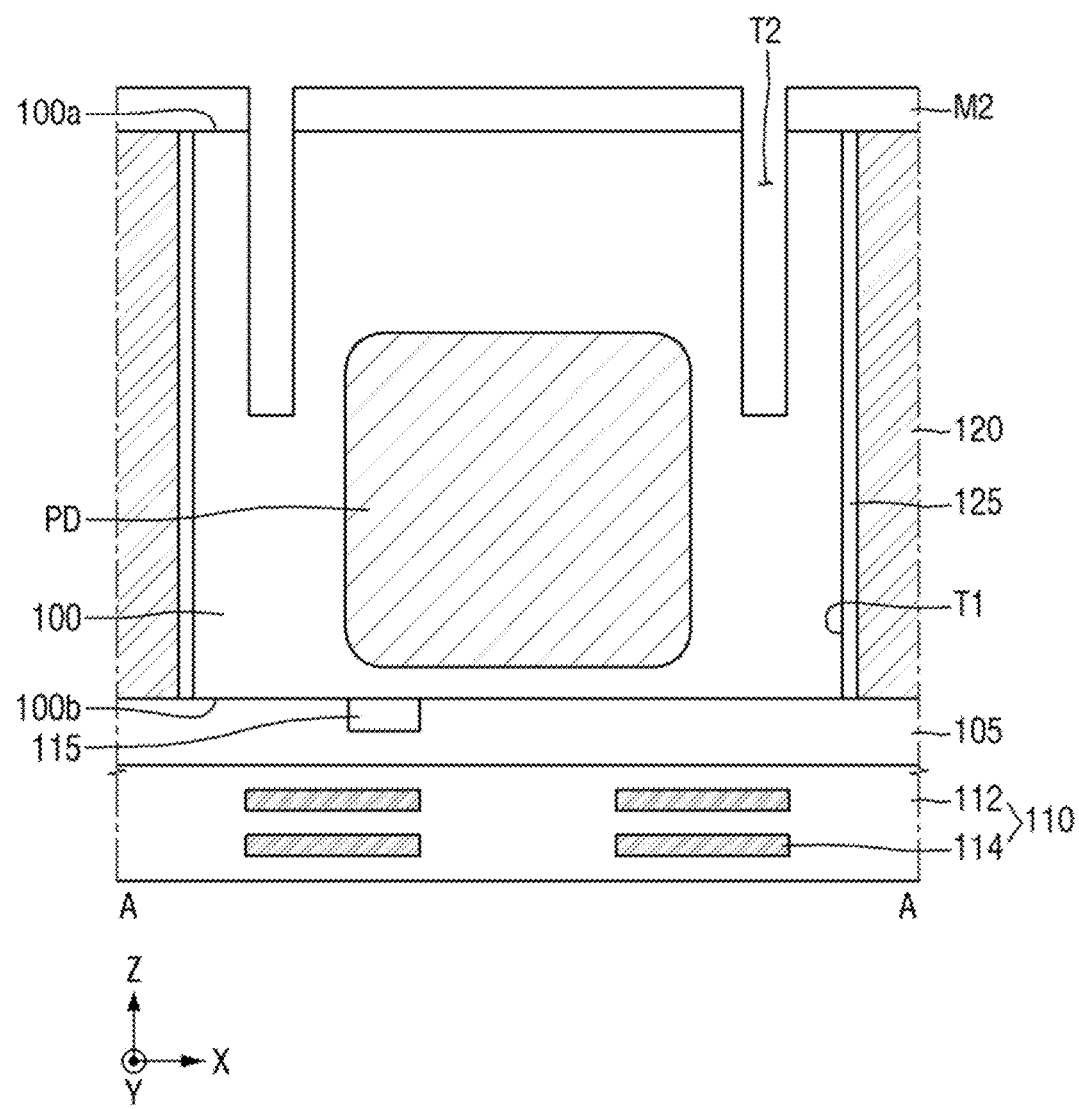

Referring to FIG. 10, a second mask pattern M2 may be formed on a first surface 100a of the substrate 100, the trench passivation layer 125 and the first isolation layer 120.

The second trench T2 may be formed in the substrate 100 by etching. For example, the substrate 100 may be etched using the second mask pattern M2 as a mask. However, the present inventive concept is not limited thereto. For example, the second trench T2 may be formed prior to the second mask pattern M2 overlay, and the second mask pattern M2 may be etched to expose the second trench T2, or may be formed with the second trench T2 exposed. The second trench T2 may be formed between the first trench T1 and the PD. Further, the second trench T2 may be formed so as to be spaced apart from the first trench T1 and the PD. The second trench T2 may be formed to penetrate through a portion of the substrate 100. For example, the second trench T2 may have a shallower depth in the third direction (e.g., the Z direction) relative to the depth of the first trench T1. The first trench T1 may be comparatively thicker in the first direction (e.g., the X direction), but the present inventive concept is not limited thereto.

Figure 11:
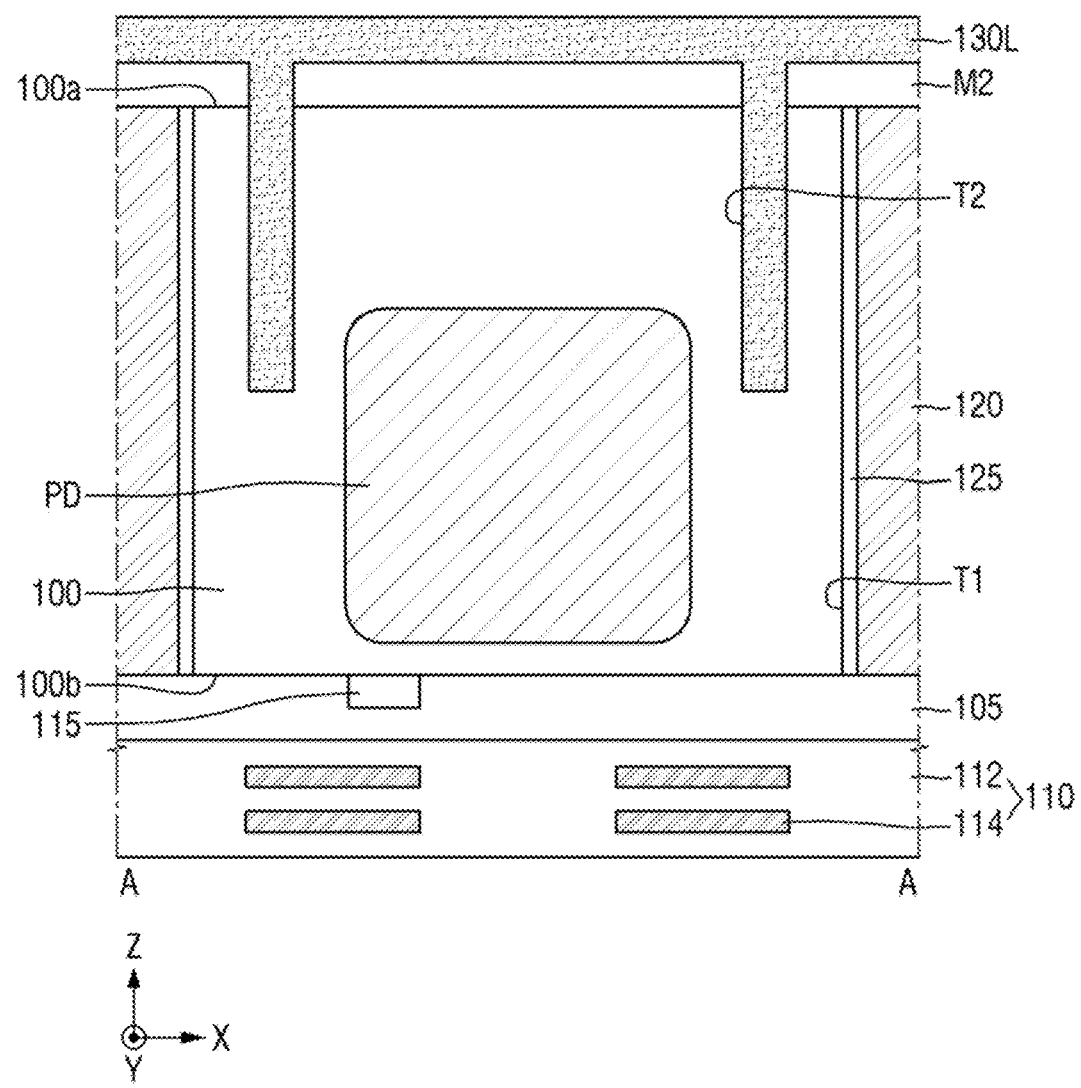

Referring to FIG. 11, a second filling layer 130L may fill the second trench T2. The second filling layer 130L may be formed also on the second mask pattern M2.

Figure 12:
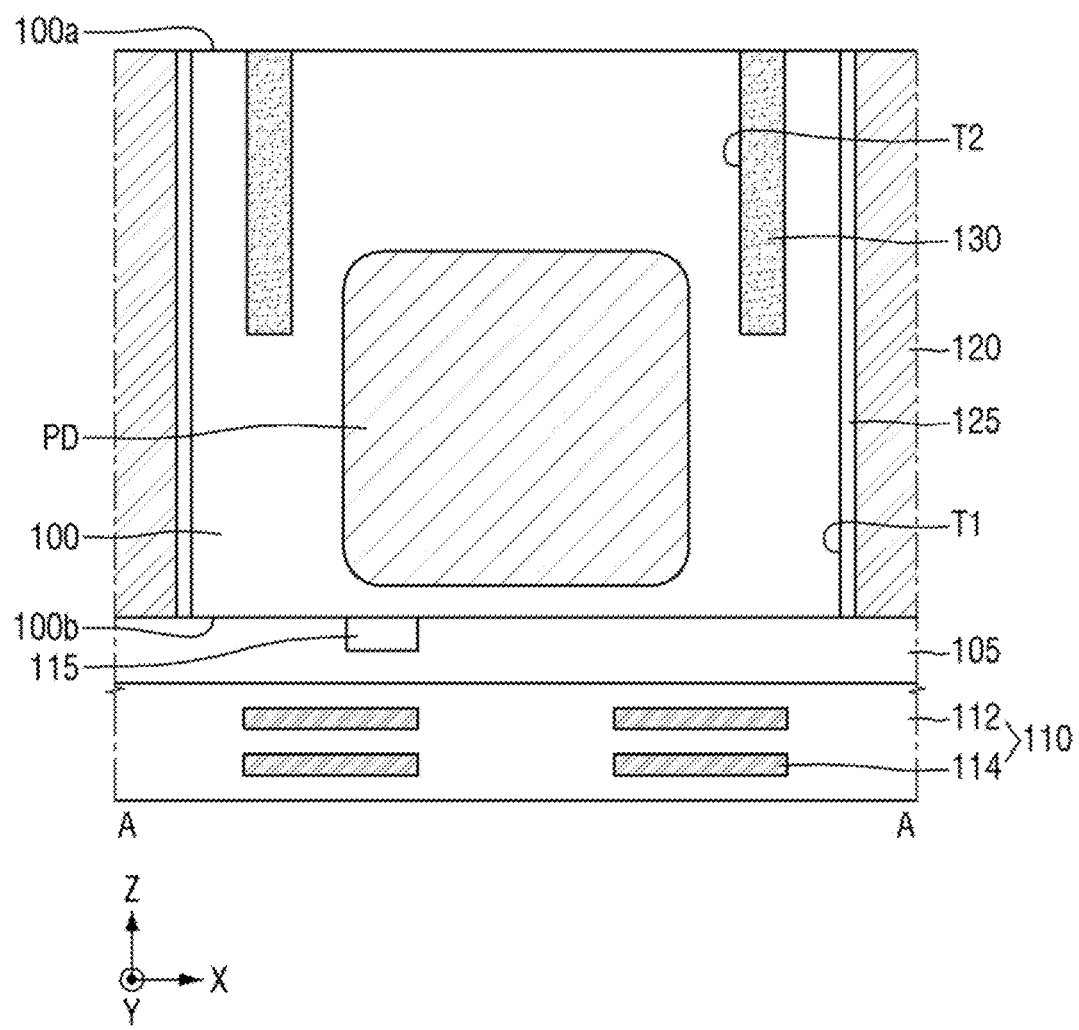

Referring to FIG. 12, the planarization etching process (e.g., CMP process) may remove a portion of the second filling layer 130L formed on a first surface 100a of the substrate 100 and the second mask pattern M2.

Through the planarization etching process, as illustrated in FIG. 12, the second filling layer 130L of FIG. 11, the trench passivation layer 125 and the first isolation layer 120 may have upper surfaces that are coplanar with the first surface 100a of the substrate 100.

Through the above described process, the second isolation layer 130 may fill an inner portion of the second trench T2.

Referring back to FIG. 4, the passivation layer 138 may be formed on a first surface 100a of the substrate 100. For example, the passivation layer 138 may be formed by using, for example, atomic layer deposition (ALD), physical vapor deposition (PVD), and chemical vapor deposition (CVD). Thereafter, the planarization layer 140 may be formed on the passivation layer 138.

The image sensor illustrated in FIG. 4 may be fabricated by forming the side anti-reflection layer 155, the color filter 150, and the microlens 160 on the planarization layer 140.

Hereafter, an image sensor according to an exemplary embodiment of the present inventive concept will be described with reference to FIG. 13. The description will primarily focus on the differences from the image sensor illustrated in the exemplary embodiment of the present inventive concept depicted in FIG. 4.

Figure 13:
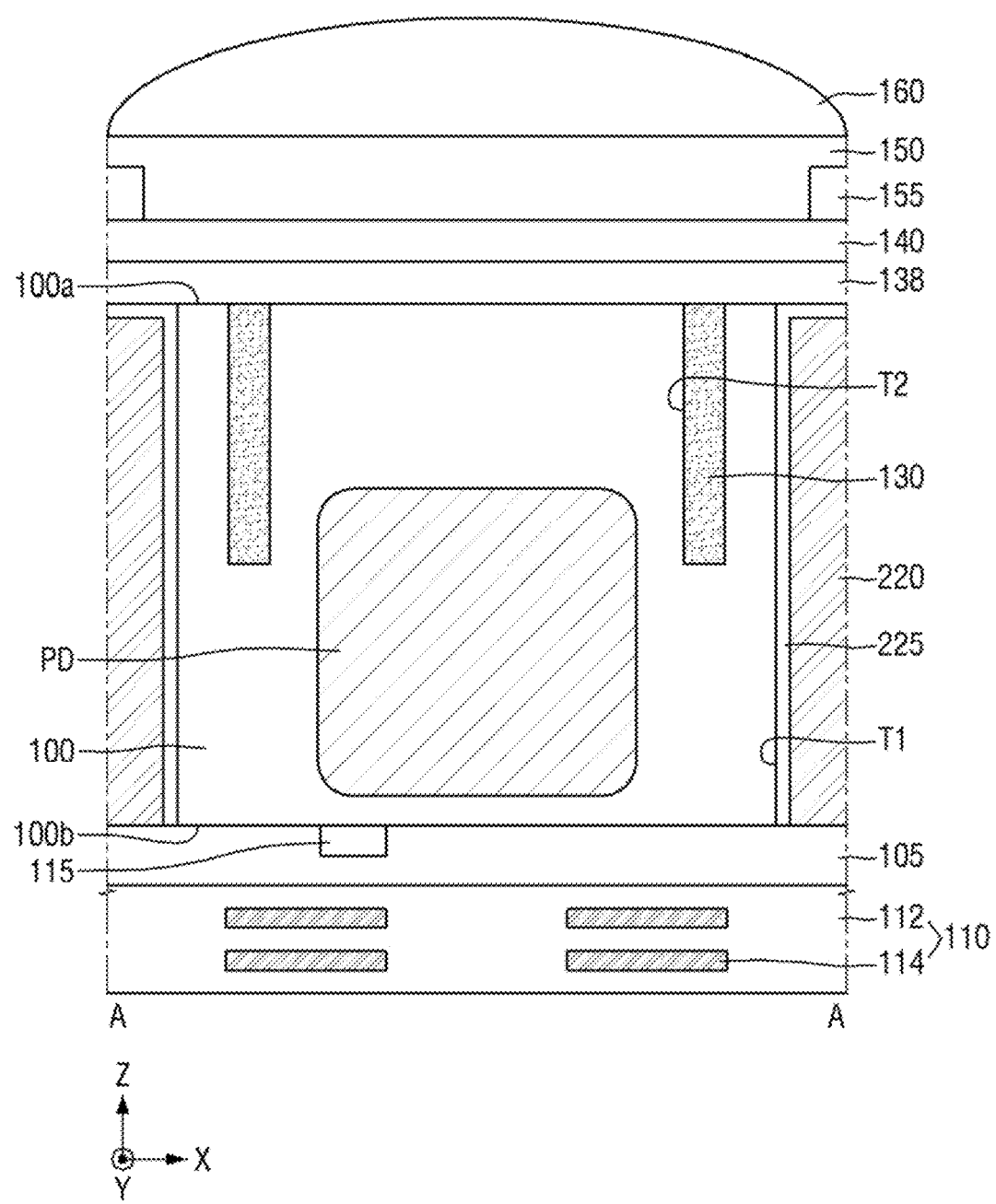
FIG. 13 is a cross-sectional view taken along line A-A of FIG. 3 illustrating an image sensor according to an exemplary embodiment of the present inventive concept.

FIG. 13 is a cross-sectional illustrating an image sensor according to an exemplary embodiment of the present inventive concept.

Referring to FIG. 13, the trench passivation layer 225 may include a vertical portion extending substantially in the third direction (e.g., the Z direction) and may at least partially cover an upper surface of the first trench T1. A horizontal portion of the trench passivation layer 125 may be disposed on an upper surface of the first isolation layer 220 and extend in the first direction (e.g., the X direction). The trench passivation layer 225 may thus at least partially cover an upper surface and a sidewall of the first trench T1.

The first isolation layer 220 may be disposed in the first trench T1 on the trench passivation layer 225. For example, the first isolation layer 220 may fill substantially the entire first trench T1. The first isolation layer 220 may not be exposed at a first surface 100a of the substrate 100 and may be disposed on the second surface 100b of the substrate 100 extending from the second surface 100b in the third direction (e.g., the Z direction) to just below the first surface 100a. Hereafter, an image sensor according to an exemplary embodiment of the present inventive concept will be described with reference to FIG. 14. The description will primarily focus on the differences from the image sensor illustrated in the exemplary embodiment of the present inventive concept illustrated in FIG. 4.

Figure 14:
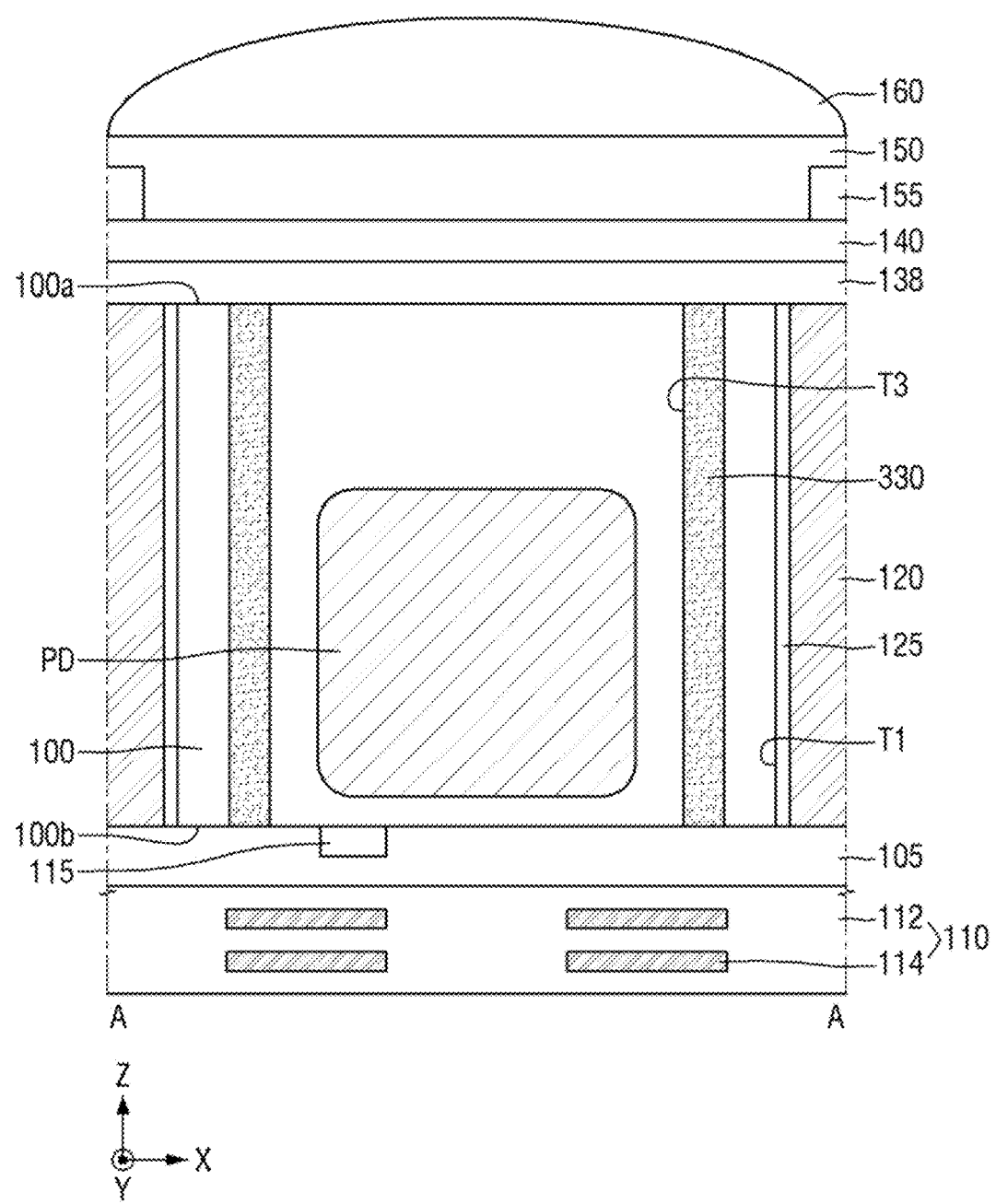
FIG. 14 is a cross-sectional view taken along line A-A of FIG. 3 illustrating an image sensor according to an exemplary embodiment of the present inventive concept.

FIG. 14 is a cross-sectional view illustrating an image sensor according to an exemplary embodiment of the present inventive concept.

Referring to FIG. 14, the second isolation layer 330 may be disposed so as to completely penetrate through the substrate 100. For example, the second trench T3 may completely penetrate through the substrate 100, and the second isolation layer 330 may be disposed in the second trench T3. In other words, the second isolation layer 330 may fill substantially the entire third trench T3.

The second isolation layer 330 may be exposed at each of the first surface 100a and the second surface 100b of the substrate 100. For example, the first trench T1 and the second trench T2 may be substantially a same length in the third direction (e.g., the Z direction).

Hereafter, an image sensor according to an exemplary embodiment of the present inventive concept will be described with reference to FIG. 15. The description will primarily focus on the differences from the image sensor according to the exemplary embodiment of the present inventive concept illustrated in FIG. 4.

Figure 15:
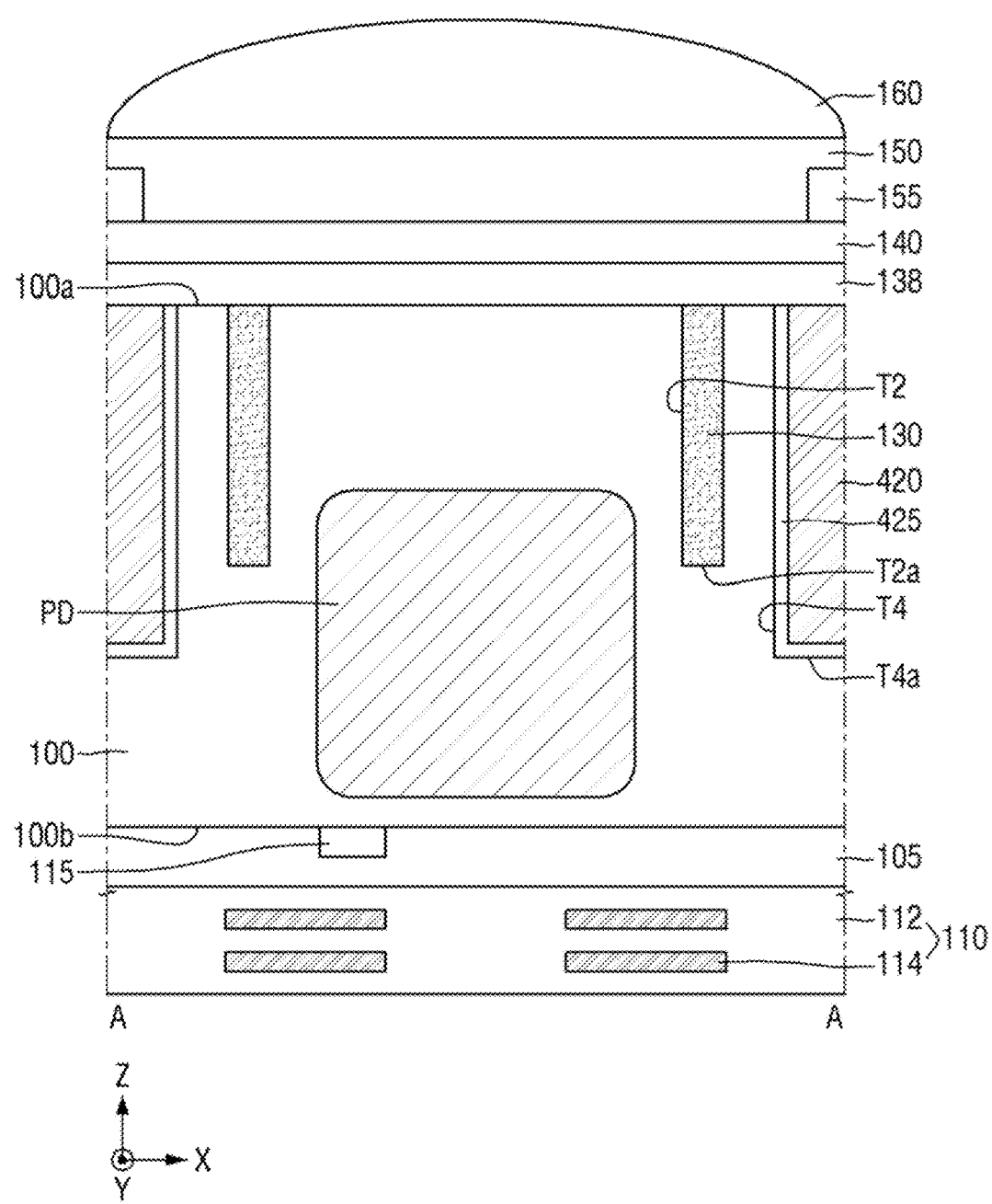
FIG. 15 is a cross-sectional view taken along line A-A of FIG. 3 illustrating an image sensor according to an exemplary embodiment of the present inventive concept.

FIG. 15 is a cross-sectional view illustrating an image sensor according to an exemplary embodiment of the present inventive concept.

Referring to FIG. 15, the first trench T4 may partially penetrate through a portion of the substrate 100 from a first surface 100a of the substrate 100. In other words, a lower surface T4a of the first trench T4 may be disposed in the substrate 100 rather than disposed in contact the second surface 100b.

The trench passivation layer 425 may at least partially cover a sidewall and a bottom surface of the first trench T4. The first isolation layer 420 may be disposed in the first trench T4 on the trench passivation layer 425. For example, the first isolation layer 420 may fill substantially the entire first trench T4, and a sidewall of the first isolation layer 420 may contact a sidewall of the trench passivation layer 425.

The first isolation layer 420 may be exposed at a first surface 100a of the substrate 100 and may not be exposed at a second surface 100b of the substrate 100. For example, the first isolation layer 420 may have a first end that is coplanar with the first surface 100a and a second end that is not coplanar with the second surface 100b.

A lower surface T4a of the first trench T4 may be disposed closer to a second surface 100b of the substrate 100 than a lower surface T2a of the second trench T2. In other words, the second trench T2 may extend further in the third direction (e.g., the Z direction) than the first trench T4 without contacting the second surface 100b. Hereafter, an image sensor according to an exemplary embodiment of the present inventive concept will be described with reference to FIG. 16. The description will be made with the primary focus on the differences from the image sensor illustrated in FIG. 4.

Figure 16:
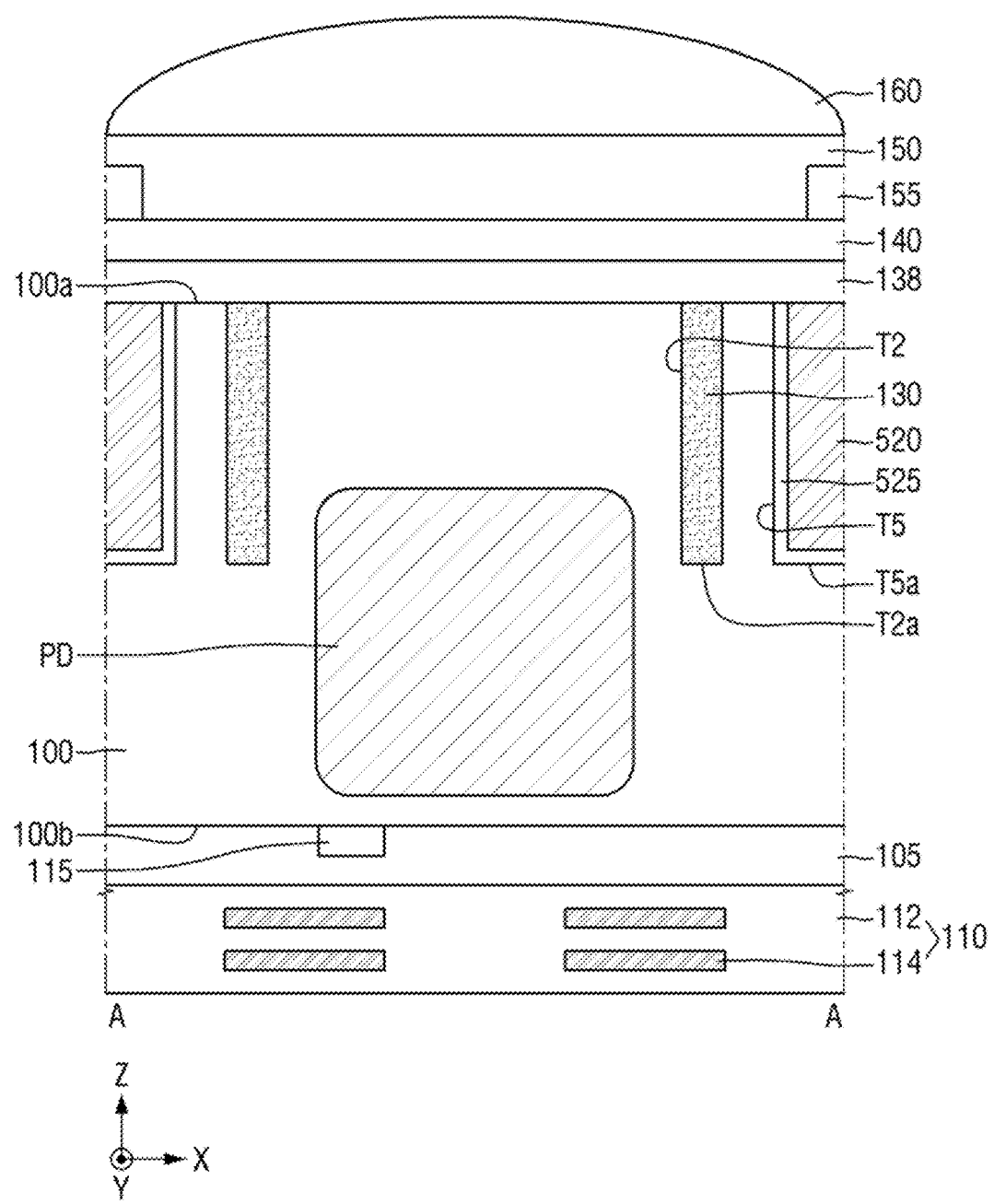
FIG. 16 is a cross-sectional view taken along line A-A of FIG. 3 illustrating an image sensor according to an exemplary embodiment of the present inventive concept.

FIG. 16 is a cross-sectional view illustrating an image sensor according to an exemplary embodiment of the present inventive concept.

Referring to FIG. 16, the first trench T5 may partially penetrate through a portion of the substrate 100 from a first surface 100a of the substrate 100. In other words, a lower surface T5a of the first trench T5 may be formed in the substrate 100.

The trench passivation layer 525 may at least partially cover a sidewall and a bottom surface of the first trench T5. The first isolation layer 520 may be disposed in the first trench T5 on the trench passivation layer 525. For example, the trench passivation layer 525 may fill substantially the entire first trench T5.

The first isolation layer 520 is exposed at a first surface 100a of the substrate 100 and is not exposed at a second surface 100b of the substrate 100.

A lower surface T5a of the first trench T5 may be formed substantially coplanar with a lower surface T2a of the second trench T2.

Hereafter, an image sensor according to an exemplary embodiment of the present inventive concept will be described with reference to FIG. 17 and FIG. 18. The description will primarily focus on the differences from the image sensor illustrated in the exemplary embodiments of the present inventive concept depicted in FIGS. 3 and 4.

Figure 17:
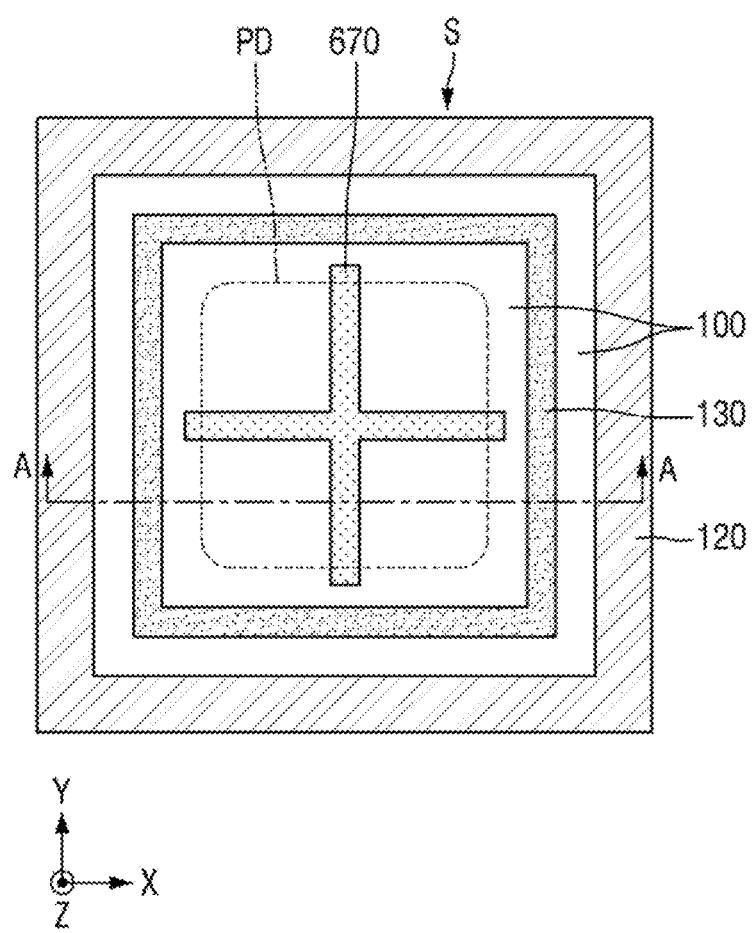
FIG. 17 illustrates a plan view of an image sensor according to an exemplary embodiment of the present inventive concept.

FIG. 17 is a plan view illustrating an image sensor according to an exemplary embodiment of the present inventive concept. FIG. 18 is a cross-sectional view taken along line A-A of FIG. 17.

Figure 18:
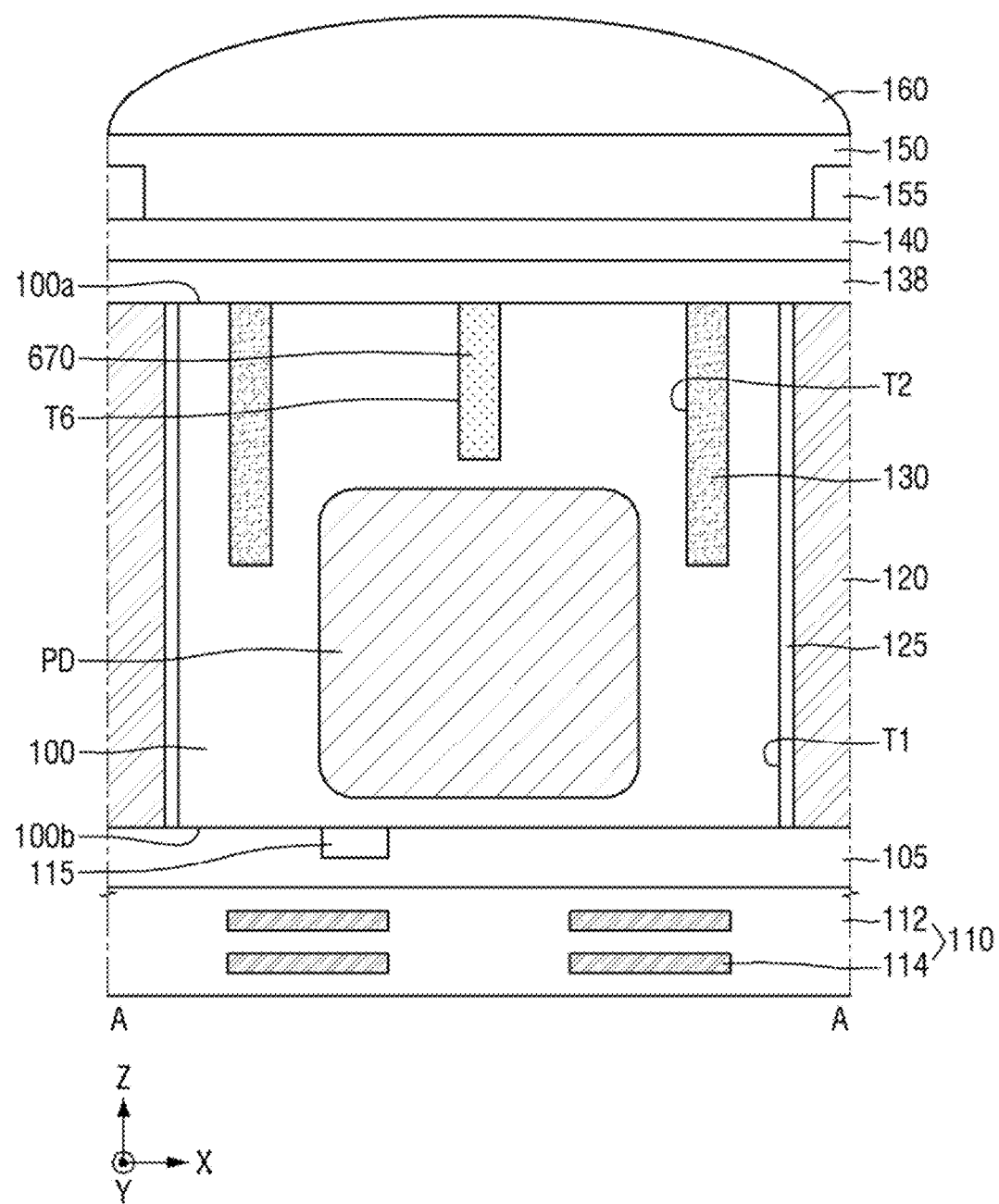
FIG. 18 is a cross-sectional view taken along line A-A of FIG. 17 illustrating an image sensor according to an exemplary embodiment of the present inventive concept.

Referring to FIG. 17 and FIG. 18, an inner reflection pattern 670 may be disposed on the substrate 100 within the perimeter defined by sides of the second isolation layer 130. For example, when viewed in a plan view, the second isolation layer 130 may form a closed line rectangular shape. The closed line rectangular shape of the second isolation layer 130 may partition the substrate 100 into an inner region and an outer region. The inner reflection pattern 670 may be disposed in the inner region of the substrate 100.

A third trench T6 may be disposed between parallel sides of the second isolation layer 130. The third trench T6 may penetrate through a portion of the substrate 100 from a first surface 100a of the substrate 100. The third trench T6 may be formed to overlap the PD in a plane parallel to an axis of the third direction (e.g., the Z direction). For example, the third trench T6 may overlap an upper surface of the PD and extend in the third direction (e.g. the Z direction) without making contact with the upper surface of the PD.

The inner reflection pattern 670 may be disposed in the third trench T6. For example, the inner reflection pattern 670 may fill substantially the entire third trench T6. The inner reflection pattern 670 is exposed at a first surface 100a of the substrate 100 and is not exposed at a second surface 100b of the substrate 100.

The inner reflection pattern 670 may have a cross shape on a plane in parallel with a first surface 100a of the substrate 100. For example, when viewed in a plan view, the inner reflection pattern 670 may have a first segment extending in the first direction (e.g., the X direction) and a second segment intersecting the first segment. The first and second segments may extend in a direction perpendicular to the direction of extension of an adjacent side of the second isolation layer 130. However, the shape of the inner reflection pattern 670 is not limited thereto. For example, the inner reflection pattern 670 may have a circular shape, a closed line rectangular shape, or a variety of other shapes.

When viewed in a plan view, the inner reflection pattern 670 may be spaced apart from the second isolation layer 130 in the first direction (e.g., the X direction) and the second direction (e.g., the Y direction). For example, ends of the first and second segments may be disposed adjacent to respective sides of the second isolation layer 130 and may extend beyond a shape outline of the PD indicated in dotted lines. However, the present inventive concept is not limited thereto. In other words, according to an exemplary embodiment of the present inventive concept, the inner reflection pattern 670 may be in contact with the second isolation layer 130. For example, surfaces (e.g., ends) of the inner reflection pattern 670 may be contiguous with respective sides of the second isolation layer 130.

The inner reflection pattern 670 may be spaced apart from the PD in the third direction (e.g., the Z direction). However, the present inventive concept is not limited thereto. In other words, according to an exemplary embodiment of the present inventive concept, the inner reflection pattern 670 may extend in an inner portion of the PD.

The inner reflection pattern 670 may be configured to reflect the incident visible light passing through the color filter 150 and guide the incident visible light to the PD.

The inner reflection pattern 670 may include, for example, silicon oxide, silicon nitride, silicon oxynitride, and/or a low-k dielectric material (e.g., a dielectric material with a lower dielectric constant than silicon oxide).

Hereafter, an image sensor according to an exemplary embodiment of the present inventive concept will be described with reference to FIG. 19. The description will primarily focus on the differences from the image sensor according to the exemplary embodiment of the present inventive concept illustrated in FIG. 3.

Figure 19:
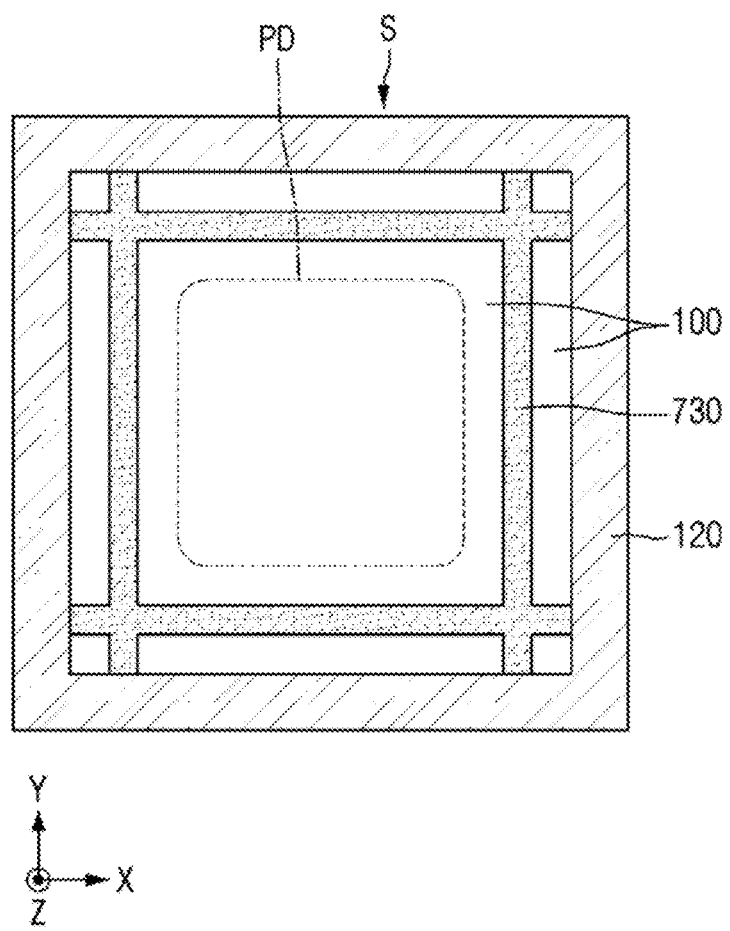
FIG. 19 is a plan view illustrating an image sensor according to an exemplary embodiment of the present inventive concept.

FIG. 19 is a plan view illustrating an image sensor according to an exemplary embodiment of the present inventive concept.

Referring to FIG. 19, the second isolation layer 730 may be disposed to surround side surfaces of the PD while being spaced apart from the PD. A first and second segments of the second isolation layer 730 may extend respectively in the first direction (e.g., the X direction) and the second direction (e.g., the Y direction) and may be in contact with the first trench T1 (e.g., a sidewall surface). The first and second segments may orthogonally intersect, and each may have ends disposed on respective sides of the first isolation layer 120. For example, the junction of the first and second segments may be disposed at a corner of the substrate 100 in which respective end portions contact orthogonally connected sides of the first isolation layer 120.

Hereafter, an image sensor according to an exemplary embodiment of the present inventive concept will be described with reference to FIG. 20. The description will primarily focus on the differences from the image sensor illustrated in the exemplary embodiment of the present inventive concept depicted in FIG. 3.

Figure 20:
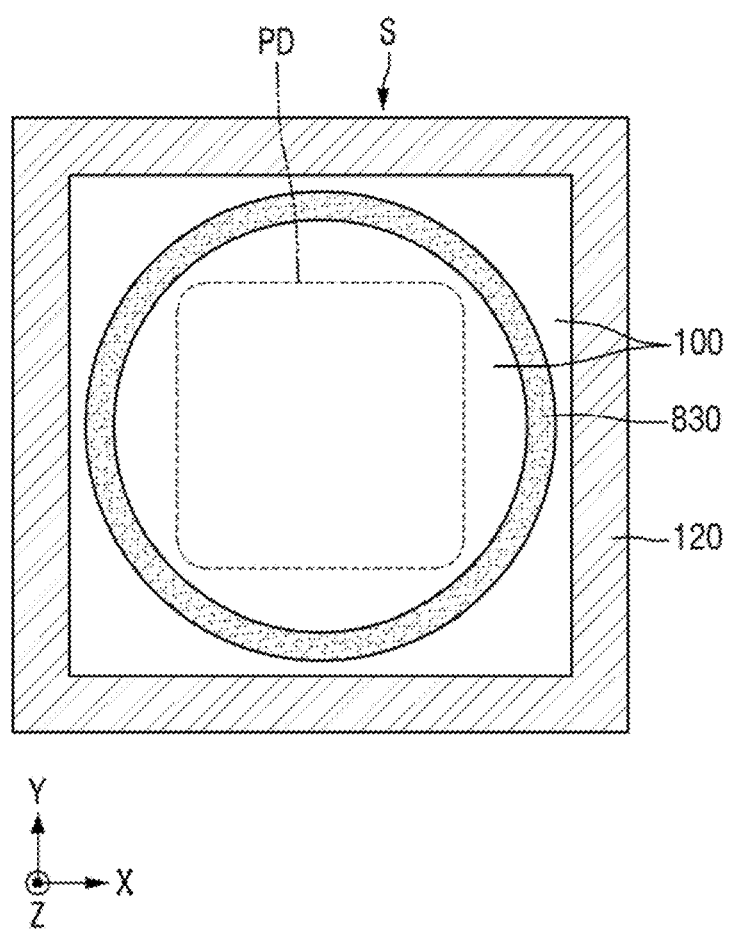
FIG. 20 is a plan view illustrating an image sensor according to an exemplary embodiment of the present inventive concept.

FIG. 20 is a plan view illustrating an image sensor according to an exemplary embodiment of the present inventive concept.

Referring to FIG. 20, the second isolation layer 830 may have a circular shape on a plane in parallel with a first surface 100a of FIG. 4 of the substrate 100.

The second isolation layer 830 may be spaced apart from each of the first isolation layer 120 and the PD.

Hereafter, an image sensor according to an exemplary embodiment of the present inventive concept will be described with reference to FIG. 21. The description will primarily focus on the differences from the image sensor illustrated in the exemplary embodiment of the present inventive concept depicted in FIG. 3.

Figure 21:
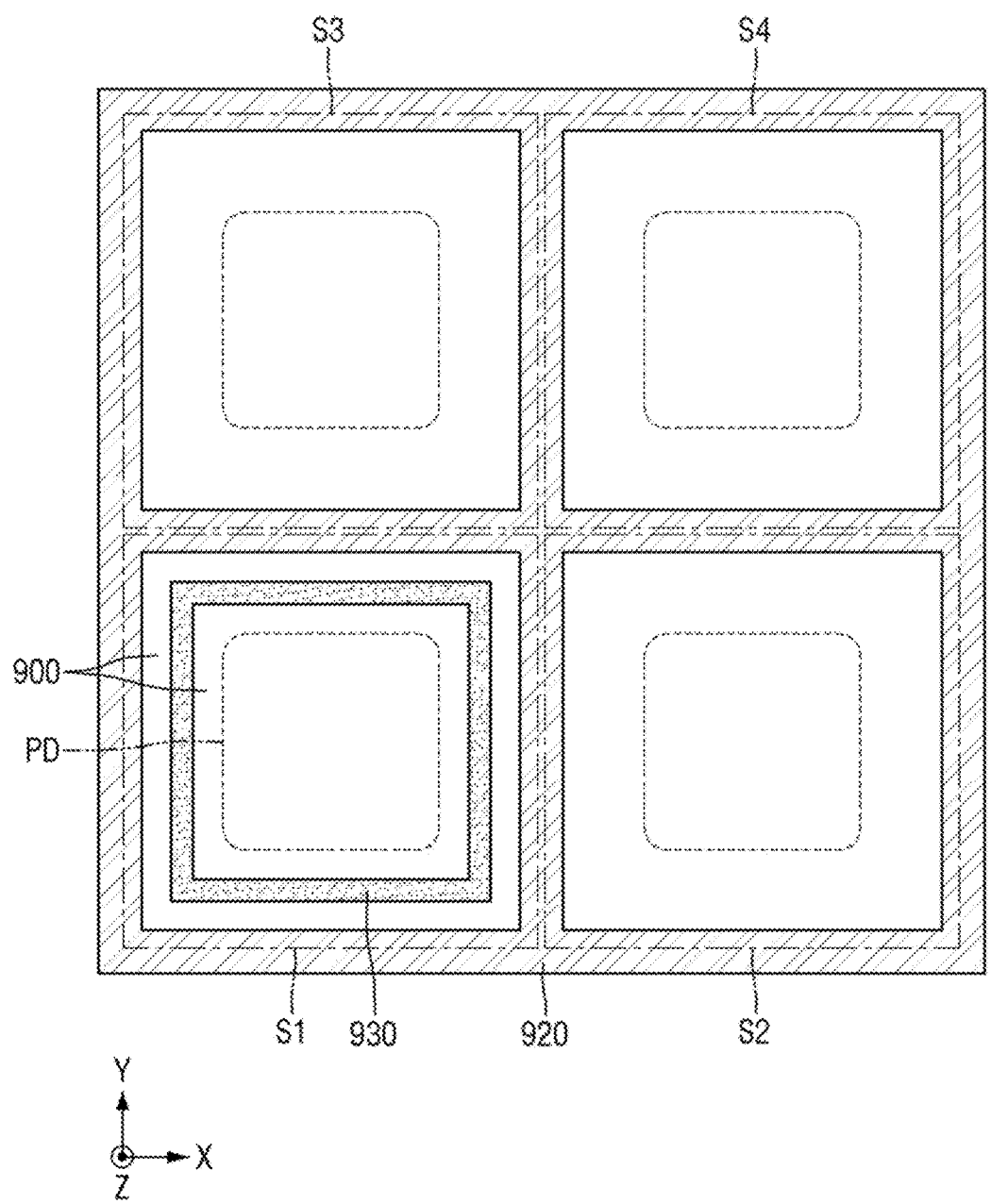
FIG. 21 is a plan view illustrating an image sensor according to an exemplary embodiment of the present inventive concept.

FIG. 21 is a plan view illustrating an image sensor according to an exemplary embodiment of the present inventive concept.

Referring to FIG. 21, first to fourth sensing regions S1, S2, S3, S4, may be disposed adjacent to one another on the substrate 900.

The second sensing region S2 may be disposed adjacent to the first sensing region S1 in the first direction (e.g., the X direction). The third sensing region S3 may be disposed adjacent to the first sensing region S1 in the second direction (e.g., the Y direction). The fourth sensing region S4 may be disposed adjacent to the third sensing region S3 in the first direction (e.g., the X direction). The fourth sensing region S4 may be disposed adjacent to the second sensing region S2 in the second direction (e.g., the Y direction).

The color filter 150 may be disposed on each of the first sensing region S1, the third sensing region S3, and the fourth sensing region S4. An infrared filter may be disposed on the second sensing region S2.

The first isolation layer 920 may define boundaries between the first to fourth sensing regions S1, S2, S3, S4.

The second isolation layer 930 is disposed on the first sensing region S1 where the color filter 150 is disposed, and is not disposed on the second sensing region S2 where the infrared filter is disposed.

Although it is illustrated in FIG. 21 that the second isolation layer 930 is disposed only on the first sensing region S1, the present disclosure is not limited thereto. In other words, the second isolation layer 930 may be disposed on at least one of the first sensing region S1, the third sensing region S3, and the fourth sensing region S4. In this case, shapes of the second isolation layer 930, which are disposed on the first sensing region S1, the third sensing region S3, and the fourth sensing region S4, may be different from one another.

Further, according to an exemplary embodiment of the present inventive concept, the second isolation layer 930 may be disposed on the second sensing region S2 where the infrared filter is disposed. While the present inventive concept has been particularly shown and described in reference to exemplary embodiments thereof, it will be understood by those of ordinary skill in the art that various changes in form and detail may be made herein without departing from the scope of the present inventive concept as defined by the following claims.

What is claimed is:
1. An image sensor comprising:
a substrate comprising a first surface and a second surface opposite to each other;
a photodiode disposed in the substrate;

a first isolation layer disposed in the substrate and forming a boundary of a first sensing region, the first isolation layer being disposed around the photodiode and having a first closed shape;
a second isolation layer disposed in the substrate within the first sensing region and having a second closed shape; and
a microlens disposed on the first surface of the substrate;
wherein the first isolation layer is spaced apart from the second isolation layer in a first direction,
wherein the first and second isolation layers are extended from the first surface to an inside of the substrate, and
wherein the photodiode is disposed within the second closed shape of the second isolation layer in a plan view.

2. The image sensor of claim 1, further comprising:
a second sensing region disposed directly adjacent to the first sensing region in the first direction,
wherein a portion of the first isolation layer is disposed at the boundary between the first sensing region and the second sensing region.

3. The image sensor of claim 2, wherein the first isolation layer and the second isolation layer have a same length in a vertical direction perpendicular to the first surface.

4. The image sensor of claim 2, wherein the first isolation layer has a first length in a vertical direction perpendicular to the first surface,
wherein the second isolation layer has a second length in the vertical direction, and
wherein the first length is different from the second length.

5. The image sensor of claim 4, further comprising:
an anti-reflection layer disposed on the first surface and disposed between the first and second sensing regions.

6. The image sensor of claim 5, wherein the first isolation layer is extended from the first surface to the second surface.

7. The image sensor of claim 5, wherein the first isolation layer has a first width in the first direction and the second isolation layer has a second width narrower than the first width in the first direction.

8. The image sensor of claim 7, wherein the second isolation layer includes $HfO_2$.

9. The image sensor of claim 8, further comprising:
an inner reflection pattern disposed within the second closed shape of the second isolation layer in the plan view and overlapped with the photodiode in the vertical direction.

10. The image sensor of claim 8, wherein the second isolation layer includes a first material and the first isolation layer includes a second material different from the first material.

11. An image sensor comprising:
a substrate comprising a first surface and a second surface opposite to each other;
a photodiode disposed in the substrate;
a first isolation layer disposed in the substrate and forming a boundary of a first sensing region, the first isolation layer being disposed around the photodiode and having a first closed line rectangular shape;
a second isolation layer disposed in the substrate within the first sensing region and having a second closed line rectangular shape;
a microlens disposed on the first surface of the substrate; and
a second sensing region directly adjacent to the first sensing region;
wherein a portion of the first isolation layer is disposed at the boundary between the first sensing region and the second sensing region,
wherein the photodiode is disposed within the second closed line rectangular shape of the second isolation layer in a plan view,
wherein the first isolation layer is spaced apart from the second isolation layer in a first direction, and
wherein the second isolation layer includes $HfO_2$.

12. The image sensor of claim 11, wherein the first isolation layer and the second isolation layer have a same length in a vertical direction perpendicular to the first surface.

13. The image sensor of claim 11, wherein the first isolation layer has a first length in a vertical direction perpendicular to the first surface,
wherein the second isolation layer has a second length in the vertical direction, and
wherein the first length is longer than the second length.

14. The image sensor of claim 13, wherein the first isolation layer is extended from the first surface to the second surface.

15. The image sensor of claim 14, wherein the first and second isolation layers are extended from the first surface to an inside of the substrate.

16. An image sensor comprising:
a substrate comprising a first surface and a second surface opposite to each other;
a photodiode disposed in the substrate;
a first isolation layer disposed in the substrate and forming a boundary of a first sensing region, the first isolation layer being disposed around the photodiode and having a first closed shape;
a second isolation layer disposed in the substrate within the first sensing region and having a second rectangular shape;
a microlens disposed on the first surface of the substrate; and
a second sensing region directly adjacent to the first sensing region;
wherein a portion of the first isolation layer is disposed at the boundary between the first sensing region and the second sensing region,
wherein the photodiode is disposed within the second closed shape of the second isolation layer in a plan view,
wherein the first isolation layer is spaced apart from the second isolation layer in a first direction,
wherein the second isolation layer includes $HfO_2$,
wherein the first isolation layer has a first length in a vertical direction perpendicular to the first surface and the second isolation layer has a second length in the vertical direction, and
wherein the first length is longer than or same as the second length.

17. The image sensor of claim 15, wherein the first closed shape is a closed line rectangular shape in the plan view.

18. The image sensor of claim 15, wherein the first closed shape is a closed circular shape in the plan view.

* * * * *